United States Patent
Lilak et al.

(10) Patent No.: US 11,393,722 B2
(45) Date of Patent: Jul. 19, 2022

(54) ISOLATION WALL STRESSOR STRUCTURES TO IMPROVE CHANNEL STRESS AND THEIR METHODS OF FABRICATION

(71) Applicant: Intel Corporation, Santa Clara, CA (US)

(72) Inventors: Aaron D. Lilak, Beaverton, OR (US); Christopher J. Jezewski, Portland, OR (US); Willy Rachmady, Beaverton, OR (US); Rishabh Mehandru, Portland, OR (US); Gilbert Dewey, Beaverton, OR (US); Anh Phan, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 77 days.

(21) Appl. No.: 16/651,116

(22) PCT Filed: Jan. 12, 2018

(86) PCT No.: PCT/US2018/013596
§ 371 (c)(1),
(2) Date: Mar. 26, 2020

(87) PCT Pub. No.: WO2019/139620
PCT Pub. Date: Jul. 18, 2019

(65) Prior Publication Data
US 2020/0303257 A1    Sep. 24, 2020

(51) Int. Cl.
*H01L 21/8234*    (2006.01)
*H01L 29/78*    (2006.01)

(52) U.S. Cl.
CPC .... *H01L 21/823431* (2013.01); *H01L 29/785* (2013.01); *H01L 29/7842* (2013.01); *H01L 29/7845* (2013.01); *H01L 29/7846* (2013.01)

(58) Field of Classification Search
CPC ........... H01L 21/823431; H01L 29/785; H01L 29/7842; H01L 29/7843; H01L 29/7845; H01L 29/7846
See application file for complete search history.

(56) References Cited

U.S. PATENT DOCUMENTS

2007/0001232 A1*  1/2007  King .................... H01L 21/78
                                                    257/368
2007/0249130 A1  10/2007  Anderson et al.
(Continued)

OTHER PUBLICATIONS

Kang, Chang Yong et al 2008, 'Effects of Film Stress Modulation Using TiN Metal Gate on Stress Engineering and Its Impact on Device Characteristics in Metal Gate/High-k Dielectric SOI FinFETs', IEEE Electron Device Letters, vol. 29, No. 5, pp. 487-490. (Year: 2008).*

(Continued)

*Primary Examiner* — Feifei Yeung Lopez
(74) *Attorney, Agent, or Firm* — Essential Patents Group, LLP

(57) ABSTRACT

In an embodiment of the present disclosure, a device structure includes a fin structure, a gate on the fin structure, and a source and a drain on the fin structure, where the gate is between the source and the drain. The device structure further includes an insulator layer having a first insulator layer portion adjacent to a sidewall of the source, a second insulator layer portion adjacent to a sidewall of the drain, and a third insulator layer portion therebetween adjacent to a sidewall of the gate, and two or more stressor materials adjacent to the insulator layer. The stressor materials can be tensile or compressively stressed and may strain a channel under the gate.

18 Claims, 17 Drawing Sheets

(56) References Cited

U.S. PATENT DOCUMENTS

| | | | |
|---|---|---|---|
| 2008/0061285 A1 | 3/2008 | Arghavani et al. | |
| 2008/0217665 A1 | 9/2008 | Chen et al. | |
| 2009/0114955 A1 | 5/2009 | Stapelmann et al. | |
| 2013/0241004 A1* | 9/2013 | Yin | H01L 29/4966 |
| | | | 257/392 |
| 2014/0264632 A1* | 9/2014 | Richter | H01L 29/7845 |
| | | | 257/401 |
| 2015/0054033 A1 | 2/2015 | Cheng et al. | |
| 2015/0348945 A1* | 12/2015 | Or-Bach | H01L 21/823828 |
| | | | 257/384 |

OTHER PUBLICATIONS

International Preliminary Report on Patentability from PCT/US2018/013596 dated Jul. 23, 2020, 12 pgs.
International Search Report and Written Opinion from PCT/US2018/013596 dated Oct. 21, 2018, 14 pgs.

* cited by examiner

ISOLATION WALL STRESSOR STRUCTURES TO IMPROVE CHANNEL STRESS AND THEIR METHODS OF FABRICATION

CLAIM OF PRIORITY

This Application is a National Stage Entry of, and claims priority to, PCT Application No. PCT/US2018/013596, filed on Jan. 12, 2018 and titled "ISOLATION WALL STRESSOR STRUCTURES TO IMPROVE CHANNEL STRESS AND THEIR METHODS OF FABRICATION", which is incorporated by reference in its entirety for all purposes.

BACKGROUND

Generally, transistors are an important basis of modern electronics. High performance transistors typically used for switching in modern computer devices may utilize epitaxially formed raise source-drain for inducing stress into a channel of the transistor to improve drive current. However, scaling in transistor size and reduction in fin cross sectional area can lead to limitations in efficiency of epitaxially formed raised source drains. Therefore, there is an ongoing need to find alternative methods for inducing strain in the channel of a transistor having reduced fin cross sectional area to optimize drive current.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1A:
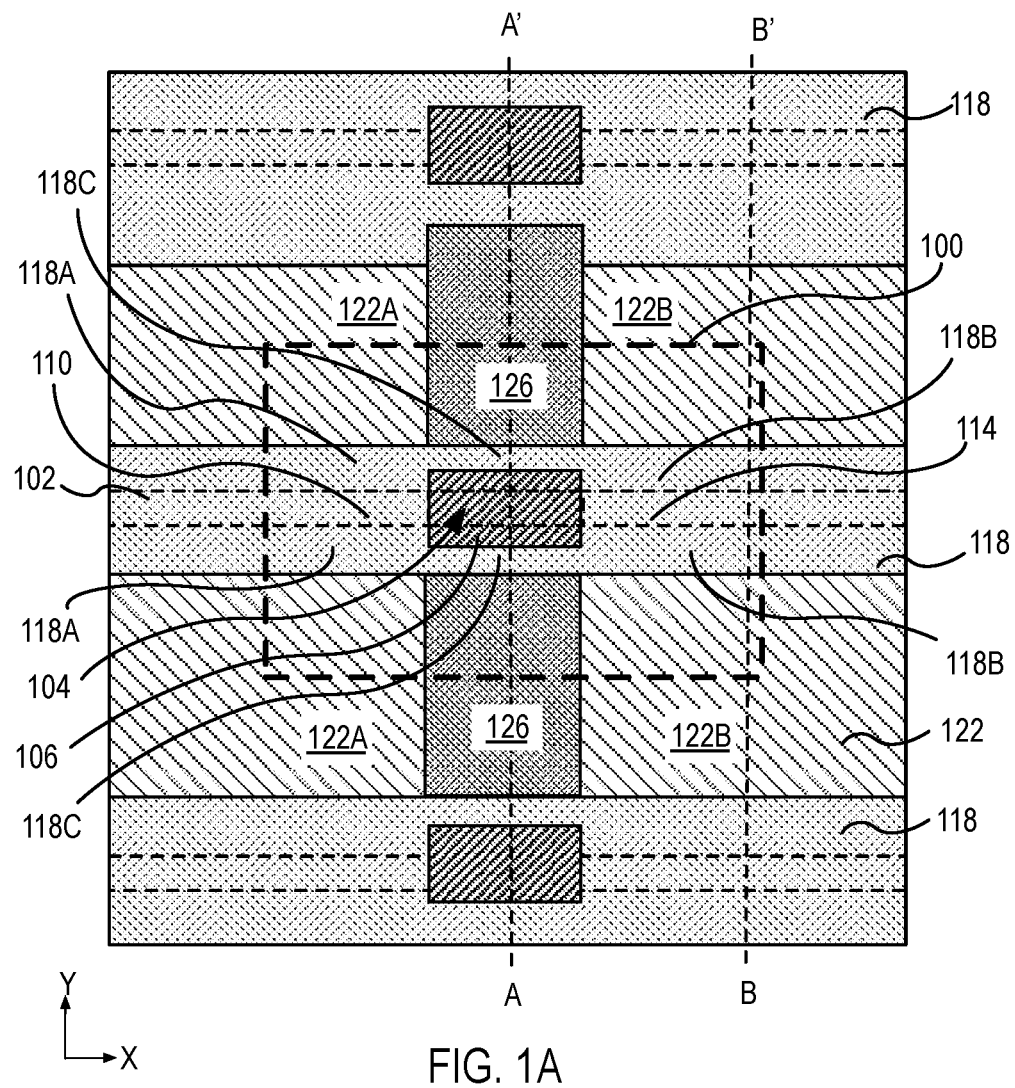
FIG. 1A illustrates a plan view of device structures with stressor layers adjacent to fin structures in accordance with embodiments of the present disclosure.

Devices including isolation wall stressor structure for logic, SoC and embedded memory applications and their methods of fabrication are described. In the following description, numerous specific details are set forth, such as novel structural schemes and detailed fabrication methods in order to provide a thorough understanding of embodiments of the present disclosure. It will be apparent to one skilled in the art that embodiments of the present disclosure may be practiced without these specific details. In other instances, well-known features, such as operations associated with the devices, are described in lesser detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As transistors are scaled, optimizing transistor drive current while operating the transistor at low voltages is highly desirable. Low voltage operation may lend to power savings. For example, one method to increase drive current is to introduce uniaxial and biaxial compressive or tensile strain in a channel of the transistor. Uniaxial compressive or tensile strain (sometimes referred to as stress) can greatly enhance the carrier mobility in short channel devices in conventional non-planar PMOS and NMOS transistors, respectively, thus, increasing drive current.

In a non-planar transistor, a fin structure forms a basis of the channel and of a source and a drain. While epitaxially engineered raised source-drain can help to induce strain in the channel, reduction in fin cross sectional area and erosion of raised source-drain epitaxy during formation of source and drain contacts can reduce their effectiveness in inducing channel strain required to boost drive current. Furthermore, reduction in distances between adjacent fins and gates may limit the volume available to grow raised source-drain epitaxy. In architectures that involve transistor stacking, formation of many of the interconnects associated with source and drain of transistors may involve deliberate removal of epitaxially engineered raised source-drain, thus diminishing the much needed strain component. Hence, alternative structures that may induce strain in the channel are of great importance for optimization of drive current. As discussed further herein, in some embodiments, a stressor layer adjacent to different regions of a transistor may be utilized to induce strain in a channel of the transistor.

Depending on the structural embodiment, the benefit of a stressor material can be greater when free surfaces from the stressor material are adjacent to the channel region. Thus, it is not the introduction of a stressor material layer alone, but also the arrangement of the stressor layer, that may help to realize channel strain. In one example, strain from a stressor layer having portions adjacent to source and drain regions can be transferred into a channel. In another example, strain from a stressor layer adjacent to a gate region, but not adjacent to a source or a drain, can also be transferred into a channel. In one example, a stressor layer including a material having an intrinsic compressive or tensile stress, adjacent to source and drain portions of a transistor, but separated by an insulator layer in between, may induce strain in the channel. While not directly in contact with the channel, the stressor layer can exert pressure into the insulator layer, which in turn can induce strain in the channel. In another example, strain from a stressor layer adjacent to a gate region, but separated by the insulator layer in between, may induce strain in the channel in a similar manner. However, the presence of a gate adjacent to sidewalls of a channel in a non-planar transistor may limit the strain induced. In such an example, to increase effectiveness, the stressor layer may have a portion at a level below a lowermost surface of a gate. This portion may be separated from a portion of the fin structure by a dielectric material. The dielectric layer may act as a more effective coupler of strain into the fin structure. It is to be appreciated that stressor materials may also be utilized along with raised source drains.

In accordance with some embodiments, a device structure includes a fin structure, a gate on the fin structure, and a source and a drain on the fin structure, where the gate is between the source and the drain. In one example, the gate is on sidewalls of the fin structure. The device structure further includes an insulator layer having a first insulator layer portion adjacent to a sidewall of the source, a second insulator layer portion adjacent to a sidewall of the drain, and a third insulator layer portion therebetween adjacent to a sidewall of the gate, and two or more stressor materials adjacent to the insulator layer. The stressor materials can include a material that is tensile or compressive, and may be an electrical conductor, semiconductor, or an insulator. One or more stressor materials may be employed. In some embodiments, a stressor material that can introduce compressive or tensile stress may be adjacent to only a gate. In other embodiments, a first of the stressor materials which can provide compressive or tensile stress may have a first portion adjacent to a source and a second portion adjacent to a drain and the second of the stressor materials may be adjacent to the gate. For advantageous induction of strain into the channel, a first of the stressor materials may be compressively or tensilely strained while the second of the stressor materials may be fully relaxed. In another example, the first of the stressor materials may be fully relaxed while the second of the stressor materials possess a compressive or tensile strain.

FIG. 1A illustrates a plan view of a device structure 100. Device structure 100 includes a fin structure (dashed lines 102), a gate 106 on the fin structure 102, and a source 110 and a drain 114 on the fin structure 102, where the gate 106 is between the source 110 and the drain 114. The device structure 100 further includes an insulator layer 118 having an insulator layer portion 118A adjacent to a sidewall of the source 110, an insulator layer portion 118B adjacent to a sidewall of the drain 118B, and an insulator layer portion 118C therebetween and adjacent to a sidewall of the gate 106. Two or more stressor layers are adjacent to the insulator layer 118. As shown, a stressor layer 122 is adjacent to the insulator layer 118. The stressor layer 122 has a stressor layer portion 122A that is adjacent to the insulator layer 118A and a stressor layer portion 122B that is adjacent to the insulator layer portion 118B. A stressor material 126 is between the stressor layer portions 122A and 122B, and adjacent to the insulator layer portion 118C.

Depending on embodiments, the stressor layer portions 122A and 122B may include a material such as a conductive layer that can provide compressive or tensile strain and the stressor layer 126 may include a dielectric material that provides little to no strain compared to the stressor layer 122. When the stressor layer 126 includes a material having little strain, the magnitude of strain is less than the compressive or tensile strain of the stressor layer portions 122A and 122B. In an embodiment, the stressor layer portions 122A and 122B include a conductive layer such as a metal or an alloy of a metal and the stressor layer 126 includes a dielectric layer. In one specific embodiment, stressor layer portions 122A and 122B include a metal, such as but not limited to, tungsten, cobalt, ruthenium, and tantalum. In another embodiment, stressor layer portions 122A and 122B include a compound of titanium such as titanium nitride, or a compound of tungsten such as tungsten nitride. In some such embodiments, the second stressor layer is a dielectric material including a compound of silicon and at least one of oxygen or nitrogen, such as silicon dioxide, silicon nitride, or silicon oxynitride or carbon doped silicon nitride.

In a different embodiment, the stressor layer portions 122A and 122B include the dielectric material and the stressor layer 126 includes the conductive layer such as a metal or an alloy of a metal. In one such example, the stressor layer portions 122A and 122B are relaxed and may not provide appreciable strain while the stressor layer 126 induces larger strain in an adjacent layer and subsequently in a channel 104 under the gate 106. Various exemplary permutations of the material compositions of the stressor layer 122 and the stressor layer 126, and the resulting stresses transferred into a channel 104 under the gate 106 is described below in association with FIG. 2A-2D.

In the illustrative embodiment, the insulator layer 118 advantageously provides electrical isolation between the gate 106 and the stressor layer 126 (when the stressor layer 122, or stressor layer 126 each include a conductive element). The insulator layer 118 also advantageously provides electrical isolation between and the stressor layer 122, and between the source 110 and the stressor layer portion 122A and between drain and second stressor layer portion 122B (when the stressor layer portions 122A and 122B include a conductive element). Insulator layer 118 may include any material that has sufficient dielectric strength to provide adequate electrical isolation. Insulator layer 118, may for example, be one or more dielectric materials known to be suitable for spacer applications. Exemplary dielectric materials include silicon dioxide, silicon nitride, silicon oxynitride, carbon doped nitride and carbon doped oxide.

The fin structure 102 may include a suitable semiconductor material such as but not limited to, single crystal silicon, polycrystalline silicon or substrates formed of other semiconductor materials such as germanium, silicon germanium or a suitable group III-V compound. Depending on whether the of device structure 100 includes an N-channel MOSFET or P-channel MOSFET, the source 110 and drain 114 may include one of P-type or N-type impurity dopants, respectively.

Figure 1B:
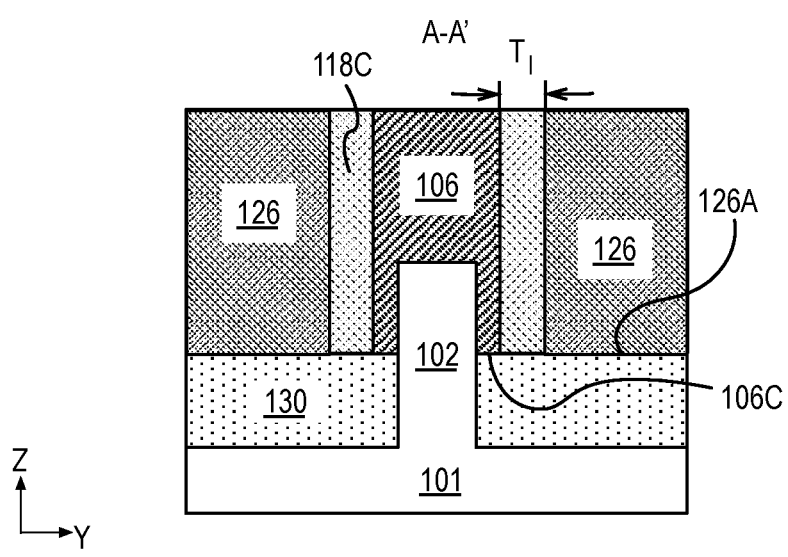
FIG. 1B illustrates a cross-sectional view of a device structure in accordance with embodiments of the present disclosure.

FIG. 1B illustrates a cross-sectional view of the device structure 100, with the A-A' line of the plan-view illustration of FIG. 1A illustrated in dashed line. As shown, the fin structure 102 extends from a portion of a substrate 101, and an isolation 130 is on the substrate 101 and adjacent to a portion of the fin structure 102. In an embodiment, substrate 101 includes a suitable semiconductor material such as but not limited to, single crystal silicon, polycrystalline silicon and silicon on insulator (SOI), or similar substrates 106 formed of other semiconductor materials such as germanium, silicon germanium or a suitable group III-V compound. As shown, the gate 106 is on an uppermost surface and on sidewalls of the fin structure 102. The gate 106 further extends onto a portion of the isolation 130. The insulator layer portion 118C is on a portion of the isolation 130. In the illustrative embodiment, the stressor layer 126 is on the isolation 130 and has a lowermost stressor layer surface 126A that is co-planar, or substantially coplanar, with a lowermost gate surface 106C.

As shown, the insulator layer portion 118C has a thickness, $T_1$, that is relatively thin to enable the stressor layer 126 to advantageously induce strain into the channel 104 layer. A thickness, $T_1$, below 10 nm may effectively allow stressor layer 126 to induce stress onto the fin structure 102. In some embodiments, the thickness of the insulator layer portion 118C is between 2 nm-5 nm.

In the illustrative embodiment, the isolation 130 advantageously provides electrical isolation between the gate 106 and the stressor layer 126 (when the stressor layer 122, or stressor layer 126 each include a conductive element). The isolation 130 also advantageously provides electrical isolation between and the stressor layer 122, and between the source 110 and the stressor layer portion 122A and between drain and second stressor layer portion 122B (when the first stressor layer portions 122A and 122B include a conductive element). Isolation 130 may include any material that has sufficient dielectric strength to provide adequate electrical isolation. Isolation 130, may for example, be one or more dielectric materials known to be suitable for shallow trench isolation (STI) applications. Exemplary dielectric materials include silicon dioxide, silicon nitride, silicon oxynitride, carbon doped nitride and carbon doped oxide.

Figure 1C:
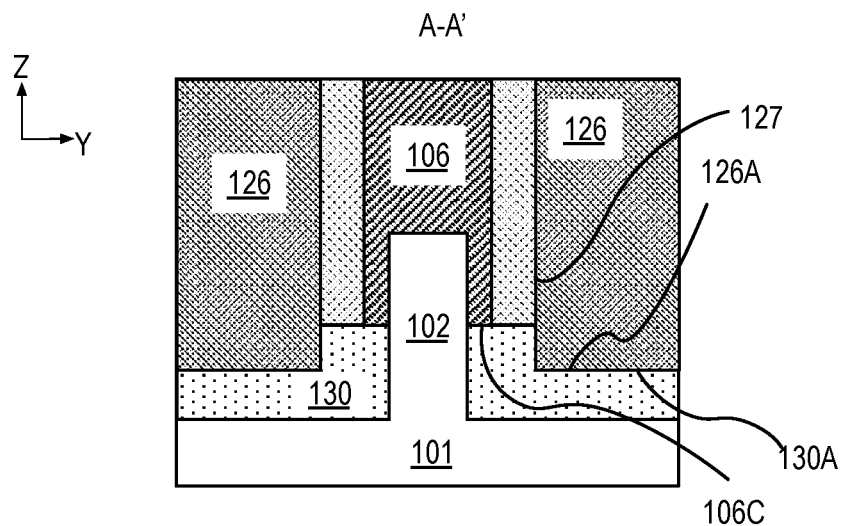
FIG. 1C illustrates a cross-sectional view of a stressor layer that is recessed below a level of a gate of the device structure, in accordance with embodiments of the present disclosure.

In other embodiments, a stressor layer 126 having a portion below a lowermost gate surface 106C strains the channel 104. In one such example, an isolation surface 130A, beyond an insulator layer sidewall 127, is below the lowermost gate surface 106C, as is illustrated in FIG. 1C. In the illustrative embodiment, the lowermost stressor layer surface 126A interfaces the isolation surface 130A and is at a level below the lowermost gate surface 106C. The lowermost second stressor layer surface 126A may be 10 nm-30 nm below the lowermost gate surface 106C to advantageously couple stress into the fin structure 102 via the isolation 130.

Figure 1D:
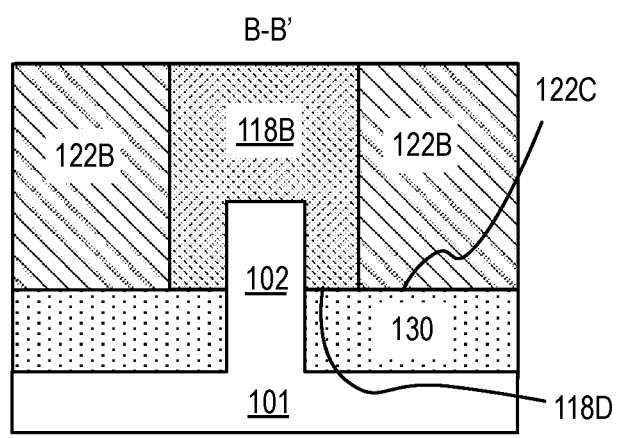
FIG. 1D illustrates a cross-sectional view of an insulator layer surrounding a fin structure of a device structure in accordance with embodiments of the present disclosure.

FIG. 1D illustrates a cross-sectional view of the device structure 100 with the B-B' line of the plan-view illustration of FIG. 1A illustrated in dashed line, in accordance with embodiments of the present disclosure. In the illustrative embodiment, the stressor layer portion 122B is on the isolation 130 and has a lowermost first stressor layer surface 122C that is co-planar or substantially coplanar with a lowermost insulator surface 118D.

Figure 1E:
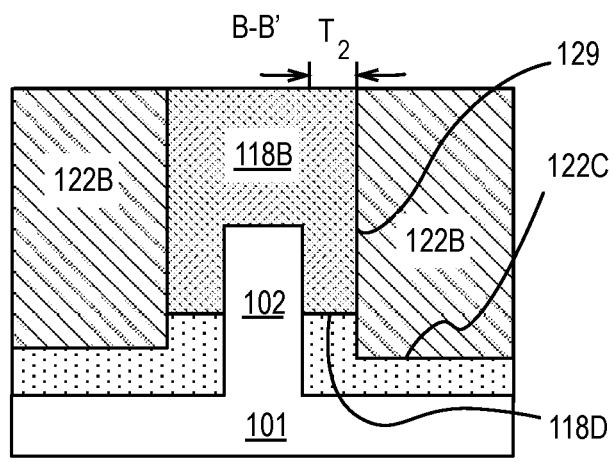
FIG. 1E illustrates a cross-sectional view of a stressor layer that is recessed below a level of an insulator layer of the device structure, in accordance with embodiments of the present disclosure.

In another example, as is illustrated in FIG. 1E, the lowermost stressor layer surface 122C is at a level below the lowermost insulator surface 118D to advantageously couple stress into the fin structure 102 via isolation 130. Additionally, the insulator layer portion 118B has a thickness, $T_2$, that is below 15 nm so that first stressor layer portion 122B can induce strain effectively onto the fin structure 102. In some embodiments, the thickness of the stressor layer 126 is at least 5 nm.

Figure 1F:
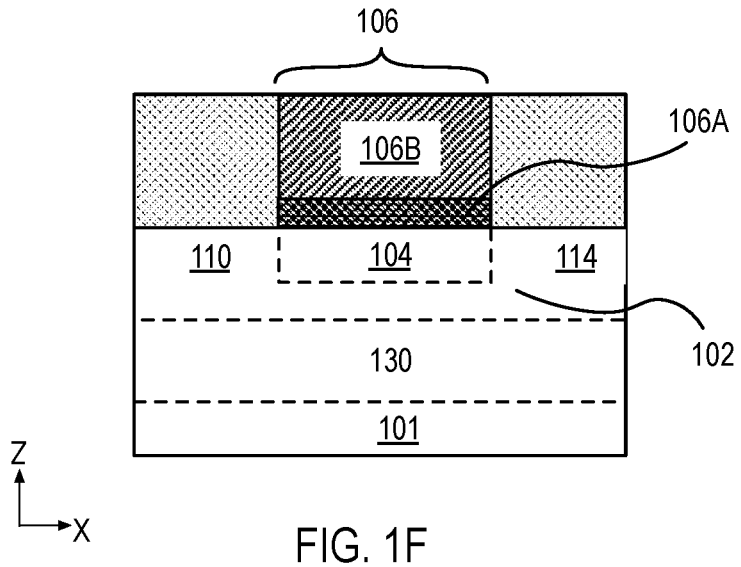
FIG. 1F illustrates a cross-sectional view of a gate electrode on a gate dielectric layer and a channel in the fin structure under the gate dielectric layer.

FIG. 1F illustrates a cross-sectional view of the gate 106 on the fin 102 and the channel 104 in the fin 102 under the gate 106. In the illustrative embodiment, gate 105 includes a gate dielectric layer 106A on the fin structure 102 and a gate electrode 106B on the gate dielectric layer 106A. The gate dielectric layer 106B may include one or more layers. The one or more layers may include silicon dioxide ($SiO_2$) and/or a high-k dielectric material. The high-k dielectric material may include elements such as hafnium, silicon, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In an embodiment, gate electrode 106B has a work function in the range of 3.8 eV-4.5 eV. Similar to traditional MOSFETs, the work function of gate electrode 106B in device structure 100 may be tuned to optimize threshold voltage. Depending on whether device structure 100 includes an N-channel MOSFET or a P-channel MOSFET, gate electrode 106B may include a P-type work function metal or an N-type work function metal to provide a PMOS or an NMOS device structure 100.

For a PMOS device structure 100, metals that may be used for gate electrode 106B include, but are not limited to, ruthenium, palladium, platinum, cobalt, nickel, and conductive metal oxides, e.g., ruthenium oxide. A P-type metal layer may enable the formation of a PMOS gate electrode with a work function between about 4.9 eV and about 5.2 eV. For an NMOS device structure 100, metals that may be used for gate electrode 106B include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer may enable the formation of an NMOS gate electrode 106B with a work function that is between about 3.9 eV and about 4.2 eV.

Figure 1G:
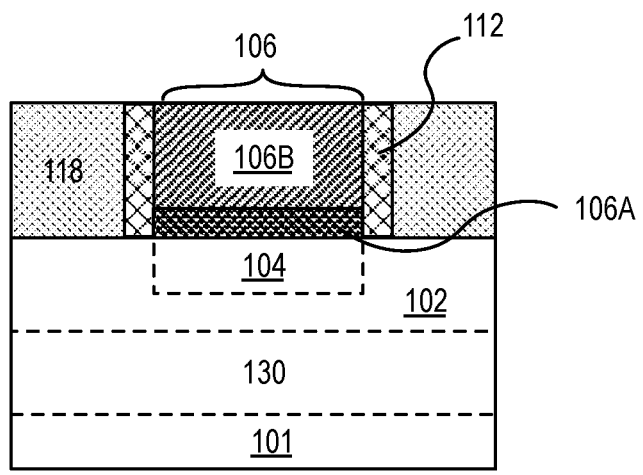
FIG. 1G illustrates a cross-sectional view of a dielectric spacer layer adjacent to a gate electrode and a gate dielectric layer.

FIG. 1G illustrates a cross-sectional view of a dielectric spacer 112 on the fin structure 102 laterally adjacent to sidewalls of the gate 106, in an embodiment of the present disclosure. A dielectric spacer 112 may be present, in some embodiments, as shown to protect the gate 106 during a fabrication process. The dielectric spacer 112 may include a material such as but not limited to silicon nitride, carbon doped silicon nitride, silicon oxynitride, or silicon carbide.

Figure 2A:
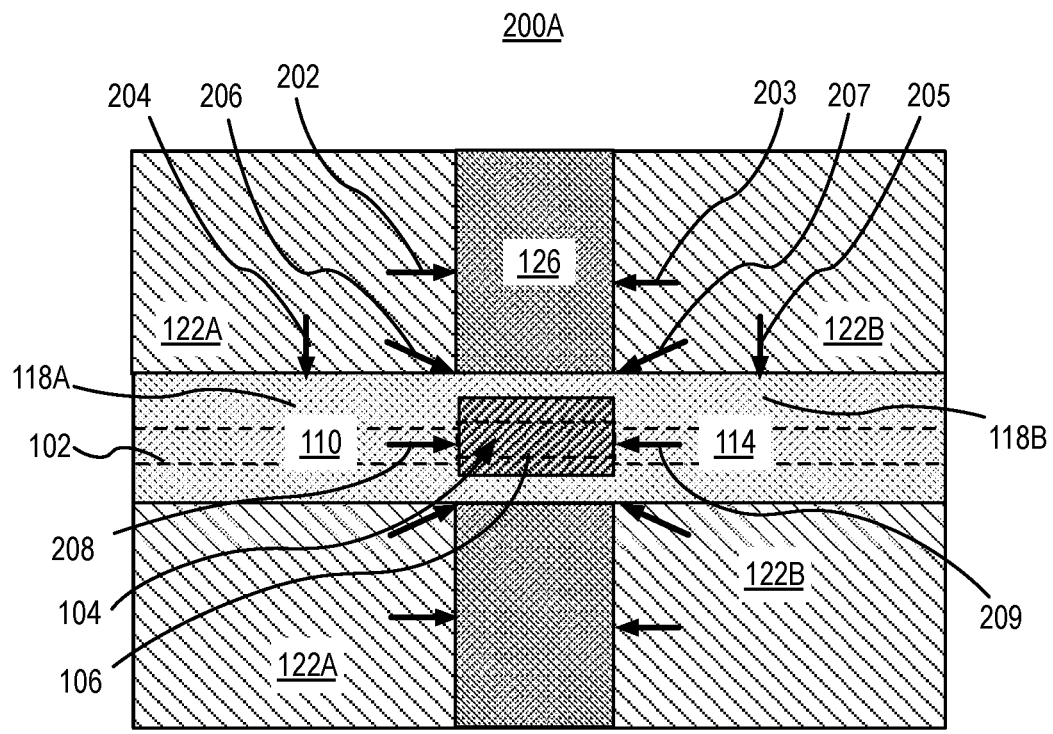
FIG. 2A illustrates a plan view of the device structure in FIG. 1A depicting the direction of stress induced in a channel, in accordance with embodiments of the present disclosure.

FIG. 2A illustrates a plan view of a device structure 200A depicting the utilization of materials with tensile stress properties in the stressor layer portions 122A and 122B adjacent to insulator layer portion 118A and insulator layer portion 118B, respectively, to advantageously couple compressive strain into channel 104 under the gate 106, in accordance with embodiments of the present disclosure. In one such example, the direction of the tensile stress in stressor layer portions 122A is depicted by arrows 202 and 204 and the direction of the tensile stress in stressor layer portion 122B is depicted by arrows 203 and 205 in FIG. 2A. As a result of the stresses along the X and Y directions in the stressor layer portions 122A and 122B, shearing stress 206 and 207 may act towards the channel 104 under the gate 106. X components of shearing stresses 206 and 207 may advantageously couple compressive strain into the channel 104, through the insulator layer portions 118A and 118C, respectively. Arrows 208 and 209 in the source 110 and drain 114 depict the resultant compressive strain in the channel 104, respectively.

Figure 2B:
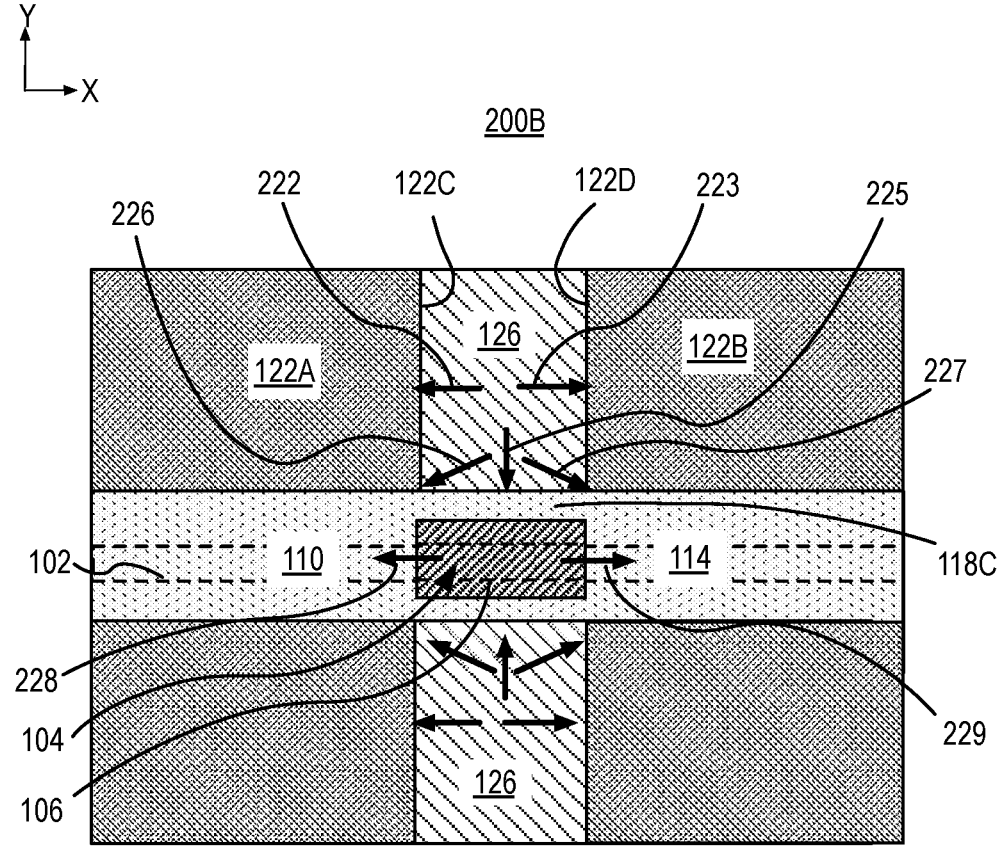
FIG. 2B illustrates a plan view of the device structure in FIG. 1A depicting the direction of stress induced in a channel, in accordance with embodiments of the present disclosure.

FIG. 2B illustrates a plan view of a device structure 200B in FIG. 1A depicting the utilization of tensile stressed materials adjacent to the third insulator layer portion 118C, to advantageously couple tensile strain into channel 104, in accordance with some embodiments. In one such example, the direction of the tensile stress in stressor layer 126 is depicted by arrows 222, 223 and 225. As a result of the stresses along the X and Y directions in the stressor layer 126, shearing stresses 226 and 227 may act away from the channel 104 under gate 106. X components of shearing stresses 226 and 227 may advantageously couple tensile strain into the channel 104, through the insulator layer portion 118C. As discussed above in association with FIG. 1C, strain coupling may also occur between stressor layer 126 and channel 104 through the isolation 130 under gate 106. Arrows 228 and 229 in the source 110 and drain 114 depict the resultant tensile strain in the channel 104, respectively.

Figure 2C:
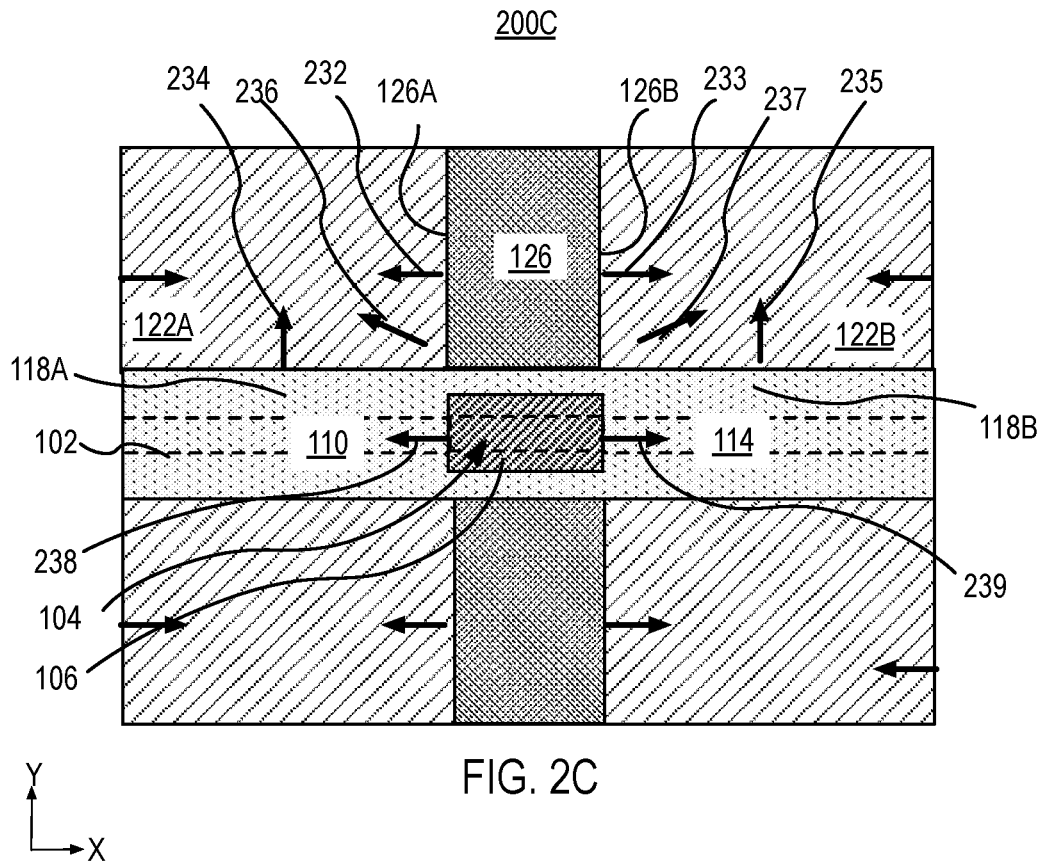
FIG. 2C illustrates a plan view of the device structure in FIG. 1A depicting the direction of stress induced in a channel, in accordance with embodiments of the present disclosure.

FIG. 2C illustrates a plan view of a device structure 200A depicting the utilization of compressively stressed materials in the stressor layer portions 122A and 122B adjacent to the insulator layer portion 118A and the insulator layer portion 118B, respectively, to advantageously couple tensile strain into channel 104 under the gate 106, in accordance with some embodiments. In one such example, the direction of the compressive stress in stressor layer portions 122A is depicted by arrows 232 and 234 and the direction of the compressive stress in stressor layer portion 122B is depicted by arrows 233 and 235 in FIG. 2C. As a result of the stresses along the X and Y directions in the stressor layer portions 122A and 122B, shearing stresses 236 and 237 may act away from channel 104 under gate 106. X components of shearing stresses 236 and 237 may advantageously couple tensile strain into the channel 104, through the insulator layer portions 118A and 118C, respectively. Arrows 238 and 239 in the source 110 and drain 114 depict the resultant tensile strain in the channel 104, respectively.

Figure 2D:
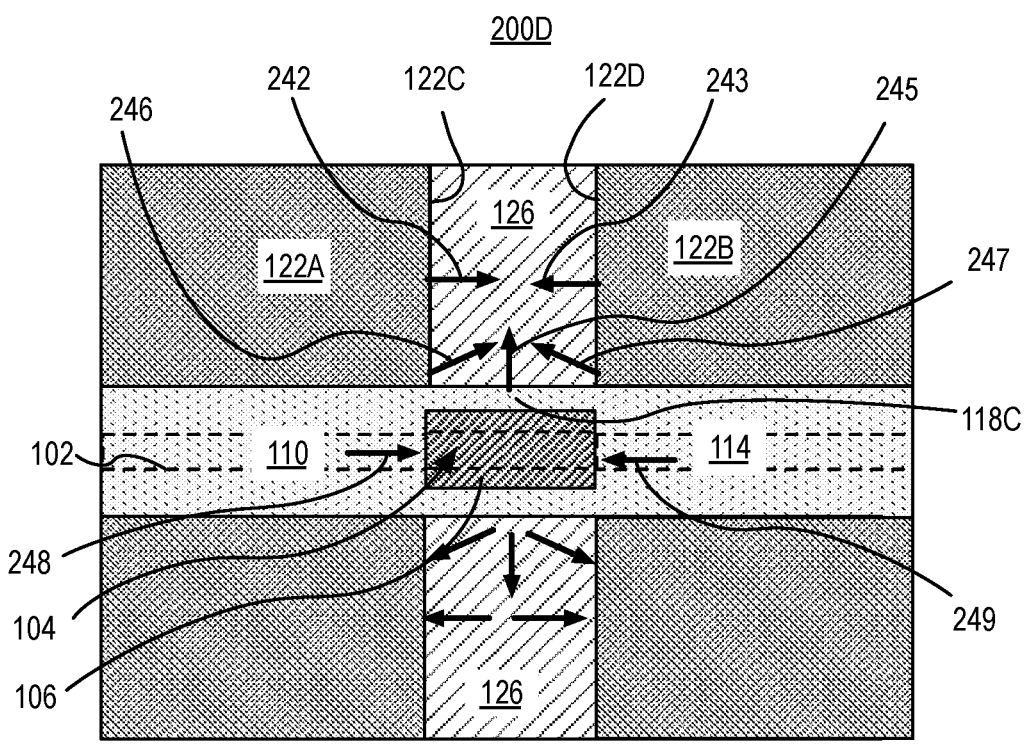
FIG. 2D illustrates a plan view of the device structure in FIG. 1A depicting the direction of stress induced in a channel, in accordance with embodiments of the present disclosure.

FIG. 2D illustrates a plan view of a device structure 200B in FIG. 1A depicting the utilization of compressively stressed materials adjacent to the insulator layer portion 118C, to advantageously couple compressive strain in channel 104, in accordance with embodiments of the present disclosure. In one such example, the direction of the compressive stress in the stressor layer 126 is depicted by arrows 242, 243 and 245. As a result of the stresses along the X and Y directions in the stressor layer 126, shearing stress may be present as depicted by arrow 246 and 247. X components of the shearing stresses 246 and 247 may advantageously couple compressive strain, depicted by arrows 248 and 249, into the channel 104 under gate 106, and through the insulator layer portion 118C. As discussed above in association with FIG. 1C, strain coupling may also occur between stressor layer 126 and channel 104 through the isolation 130 under the gate 106. Arrows 248 and 249 in the source 110 and drain 114 depict the resultant compressive strain in the channel 104, respectively.

While the discussions above are described with respect to transistors on a single plane, stressor layers may also be incorporated in a stacked transistor architecture. Depending on embodiments, a first device structure having any one of the configurations described in FIG. 2A-2D, may be stacked directly vertically above a second device structure having any one of the configurations described in FIG. 2A-2D for vertical transistor integration.

Figure 3A:
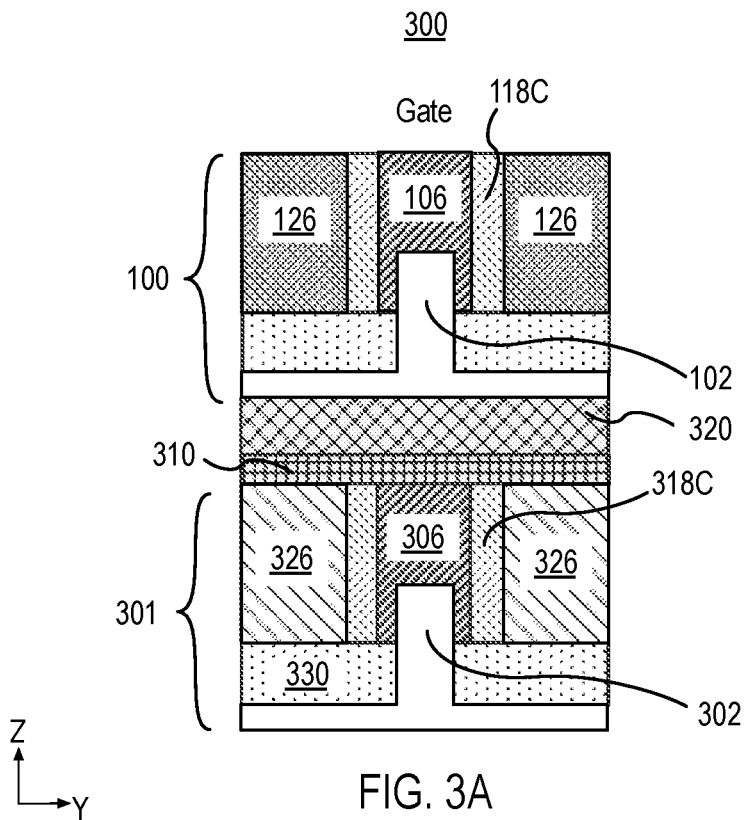
FIG. 3A illustrates a cross sectional view across a gate of a first device structure including a stressor layer stacked above a second device structure including a second stressor layer, in accordance with embodiments of the present disclosure.

FIG. 3A illustrates a cross sectional view of a stacked device structure 300. The stacked device structure 300 includes a first device structure such as device structure 100 stacked above a second device structure 301, in accordance with embodiments of the present disclosure.

In one or more embodiments, device 301 may have functions of device 200B—for e.g. wherein fin structure 302, stressor layer 326, gate 306, third insulator portion 318C and isolation 330 correspond functionally to fin structure 102, second stressor layer 104, gate 106, insulator portion 118C and isolation 130, respectively.

In the illustrative embodiment, gate 106 from the device structure 100 is directly above gate 306 from the device structure 301. As shown, the gate 106 and fin structure 102 of device structure 100 are aligned (along X and Y directions) with gate 306 and fin structure 302 of device 301, respectively. The stacked device structure 300 also includes an adhesion layer 310 above the second device structure 301 and a bonding layer 320 above the adhesion layer 310. In an embodiment, the adhesion layer 310 includes a material that may provide etch stop properties such as a silicon nitride. Thicknesses of the adhesion layer 310 may range 10 nm-50 nm. The bonding layer 320 may include any material that has sufficient dielectric strength to provide adequate electrical isolation such as, but not limited to, silicon oxide, silicon carbide, or carbon doped silicon oxide. Thicknesses of the bonding layer 320 may range 50 nm-100 nm.

In a first example, the stressor layer 126 may include a dielectric layer such as, but not limited to, silicon oxide, silicon nitride or silicon oxynitride. In one such embodiment, the stressor layer 326 may include an elemental metal or a metal alloy. The elemental metal or the metal-alloy of the stressor layer 326 may have compressive or tensile stress.

In a second example, the stressor layer 126 may include an elemental metal or a metal alloy, that may be have either compressive or tensile stress, and the second stressor layer 326 may include a dielectric layer such as, but not limited to, silicon oxide, silicon dioxide, silicon nitride or silicon oxynitride.

In a third example, the stressor layer 126 may include a dielectric layer such as, but not limited to, silicon oxide, silicon nitride or silicon oxynitride and the stressor layer 326 may include a dielectric layer such as, but not limited to, silicon oxide, silicon nitride or silicon oxynitride.

In a fourth example, the stressor layer 126 may include a metal or a metal alloy, that may have either compressive or tensile stress, and the stressor layer 326 may include a metal or a metal alloy, that may have either compressive or tensile stress.

Figure 3B:
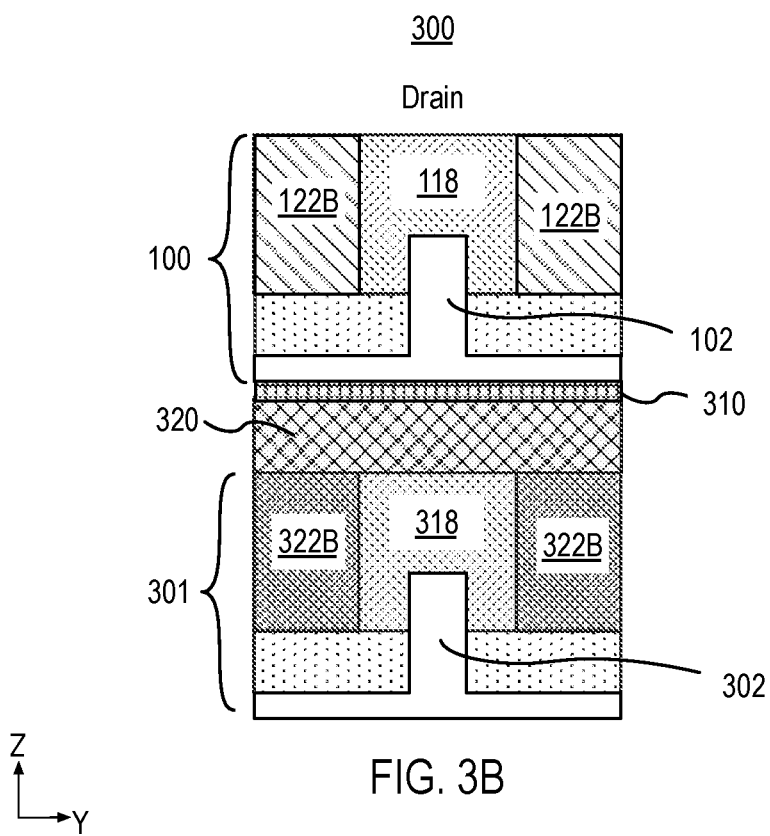
FIG. 3B illustrates a cross sectional view across a drain of the first device structure stacked above the second device structure, in accordance with embodiments of the present disclosure.

FIG. 3B illustrates a cross sectional view of the stacked device structure 300 where the cross section depicts a cross section of drains of device structures 100 and 301.

In one or more embodiments, device 301 may have functions of device 200B—for e.g. wherein insulator layer 318 and first stressor layer portion 322B correspond functionally to insulator layer 118 and first stressor layer portion 122B, respectively.

When the first device structure 100 and the second device structure 300 are stacked above each other as described above, the following permutations may occur. In a first example, the stressor layer portion 122B includes a metal or a metal alloy, that may have either compressive or tensile stress, and the stressor layer portion 322B of device 301 includes a dielectric layer such as but not limited to silicon oxide, silicon nitride or silicon oxynitride. In one such example, the stressor layer 126 in device structure 200A includes a dielectric layer such as but not limited to silicon oxide, silicon nitride or silicon oxynitride and the second stressor layer 326 includes a metal or a metal alloy that is compressive or tensile.

In a second example, the stressor layer portion 122B includes a dielectric layer such as but not limited to silicon oxide, silicon nitride or silicon oxynitride and the stressor layer portion 322B of device 301 includes a metal or a metal alloy, that has either compressive or tensile stress. In one such example, stressor layer 126 includes a metal or a metal alloy, that may have either compressive or tensile stress, and the second stressor layer 326 includes a dielectric layer such as but not limited to silicon oxide, silicon nitride or silicon oxynitride.

In a third example, the first stressor layer portion 122B includes a metal or a metal alloy, that may be either compressive or tensile and the first stressor layer portion 322B of device 301 includes a metal or a metal alloy, that is either compressive or tensile. In one such example, the stressor layer 126 includes a dielectric layer such as but not limited to silicon oxide, silicon nitride or silicon oxynitride and the second stressor layer 326 includes a dielectric layer such as but not limited to silicon oxide, silicon nitride or silicon oxynitride.

In a fourth example, the first stressor layer portion 122B includes a dielectric layer such as but not limited to silicon oxide, silicon nitride or silicon oxynitride and the first stressor layer portion 322B of device 301 includes a dielectric layer such as but not limited to silicon oxide, silicon nitride or silicon oxynitride. In one such example, stressor layer 126 includes a metal or a metal alloy, that may be either compressive or tensile and the second stressor layer 326 includes a metal or a metal alloy, that may be either compressive or tensile.

In a fifth example, the first stressor layer portion 322B (and portion 322A, not shown) and the second stressor layer 326 of device 301 each include a dielectric layer such as but not limited to silicon oxide, silicon nitride or silicon oxynitride. In such an example, the device structure 301 may not have a stressor layer that can advantageously couple strain into the channel.

Figure 4:
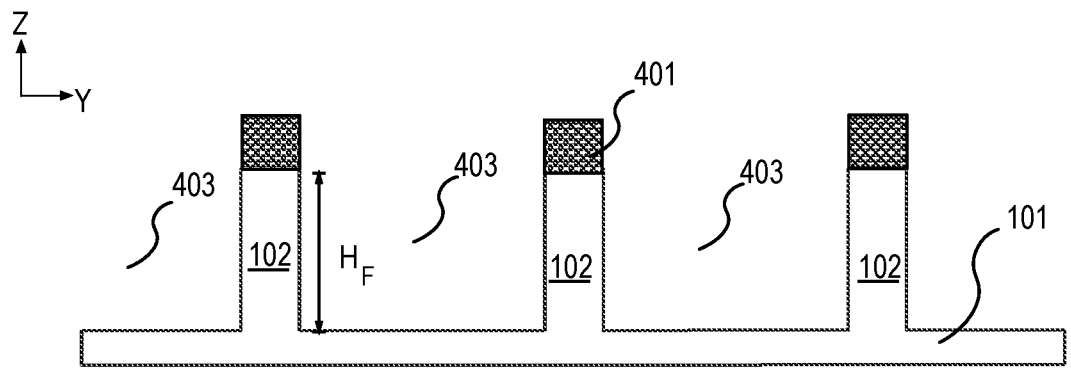
FIG. 4 illustrates a cross-sectional view of a plurality of fin structures formed in a substrate.

FIG. 4 illustrates a cross-sectional view of fin structures 102 formed in a substrate 101. In an embodiment, a dielectric hardmask layer is deposited onto the surface of the substrate 101. The dielectric hardmask layer may include a material such as silicon oxide or silicon nitride or a combination of silicon oxide or silicon nitride. In an embodiment, a resist mask is formed on the dielectric hardmask layer. In one example, the dielectric hardmask layer is subsequently patterned by a plasma etch process and the resist mask is then removed. The patterned dielectric hardmask layer is utilized as a mask 401 to pattern the fin structures 102. In an embodiment, a plasma etch is utilized to pattern the substrate 101 to form the fin structures 102 and trench openings 403 illustrated in FIG. 4. Depending on the embodiment, the fin structures 102 have a height, $H_F$, between 100 m-200 nm. While sidewalls of each fin structure 102 has a vertical sidewall profile in the illustrated example, fin structures 102 may also be formed having slanted sidewalls in other examples.

Figure 5:
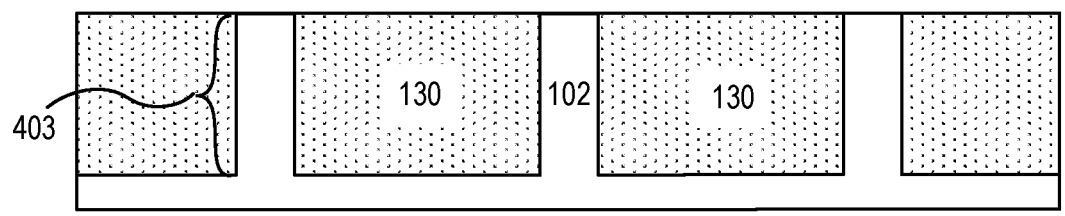
FIG. 5 illustrates a cross-sectional view of the structure of FIG. 4 following the formation of an isolation adjacent to the plurality of fin structures.

FIG. 5 illustrates the structure of FIG. 4 following the formation of an isolation 130 adjacent to each fin structure 102. In an embodiment, a dielectric layer is then blanket deposited into the trench openings 403, on sidewalls of the fin structures 102 and on the mask 401. The dielectric layer is then subsequently planar zed. In one instance, a chemical mechanical planarization (CMP) process may be utilized to planarize the dielectric layer to form isolation 130. In the illustrative embodiment, the CMP process also removes the mask 401 and upper portions of the fin structures 102 and forms uppermost surfaces of the isolation 130 and uppermost surfaces of fin structures 102 that are co-planar or substantially co-planar.

Figure 6:
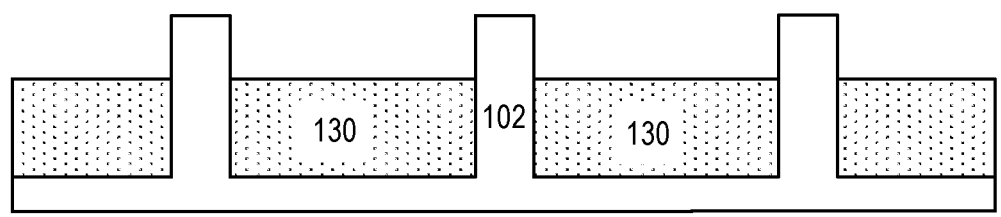
FIG. 6 illustrates a cross-sectional view of the structure of FIG. 5 following the recess of the isolation below a level of uppermost surfaces of the plurality of fin structures.

FIG. 6 illustrates the structure of FIG. 5 following the recess of the isolation 130 below a level of uppermost surfaces of the fin structures 102. In an embodiment, a wet chemical process is utilized to selectively remove portions of the isolation 130 and recess the uppermost surface below the level of the uppermost surface of the fin structures 102. Depending on the embodiment, the isolation 130 may be recessed between 15 nm-60 nm.

Figure 7:
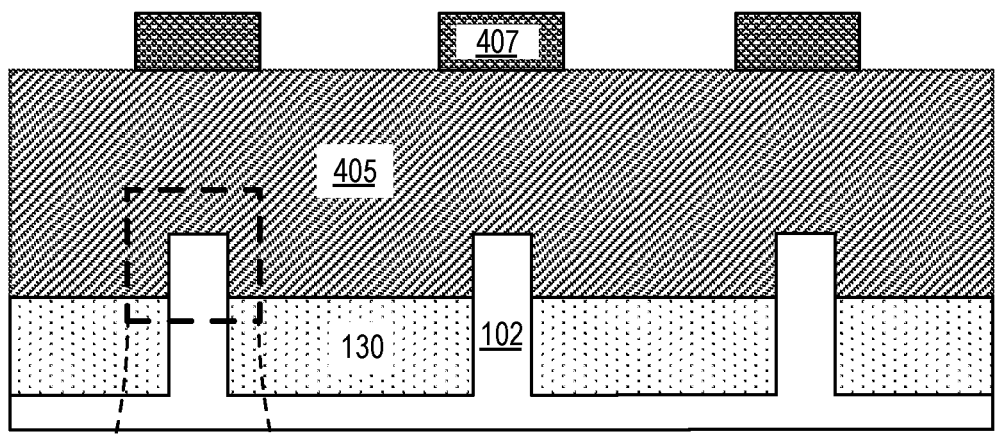
FIG. 7 illustrates a cross-sectional view of the structure of FIG. 6 following the formation of a gate stack on the plurality of fin structures and the formation of a mask on the gate stack.

FIG. 7 illustrates the structure of FIG. 6 following the formation of a gate layer 405 on the fin structures 102 and on uppermost surfaces of the isolation 130, and formation of a mask 407 on the gate layer 405. In one embodiment, a dummy gate layer may be first deposited and patterned, and replaced in a later operation by a gate electrode having the requisite work function. In other embodiments, such as will be described herein, the gate to be formed includes gate layer having the requisite work function metal as deposited which is then patterned into a gate.

The gate layer 405 may include a gate dielectric layer 405A and a gate electrode layer 405B as illustrated in the enhanced cross-sectional illustration of FIG. 7. Depending on embodiments, gate dielectric layer 405A and gate electrode layer 405B include a same material or substantially same material as the materials of the gate dielectric layer 106A and gate electrode layer 106B described in association with FIG. 1F. The gate dielectric layer 405A may be formed by an atomic layer deposition process (ALD) process, for instance, to ensure conformal deposition on sidewalls of the fin structures 102. A conformal deposition process, for example, may provide a film with a uniform thickness on the uppermost surfaces and on sidewalls of the fin structures 102. The gate dielectric layer 405A may be deposited to a thickness in the range of 2 nm-20 nm. In an embodiment, the gate dielectric layer 405A is a layer of hafnium oxide that is deposited to a thickness in the range of 2 nm-10 nm. A gate electrode layer 405B is subsequently deposited on the gate dielectric layer 405A. In an embodiment, gate electrode layer 405B is blanket deposited by an atomic layer deposition process (ALD) process or a physical vapor deposition (PVD) process. In other embodiments, a physical vapor deposition process is utilized to deposit the gate electrode layer 405B. In one embodiment, as shown the gate layer 405 is planarized prior to formation of a mask 407. Mask 407 may include a same material or substantially the same material as the material of the mask 401 and be formed by substantially a similar method as the method utilized to form mask 401.

Figure 8:
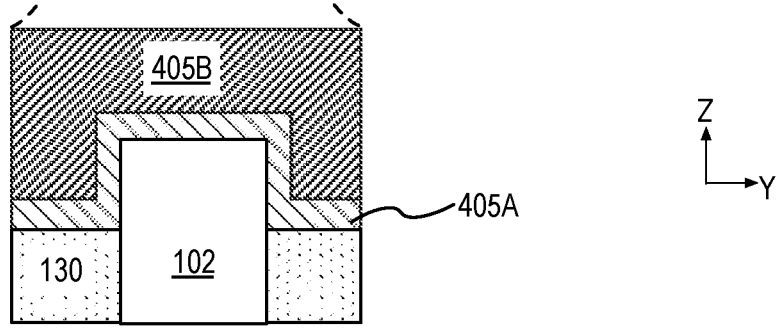
FIG. 8 illustrates a cross-sectional view of the structure of FIG. 7 following the formation of a gate on each of the plurality of fin structures.
Figure 8:
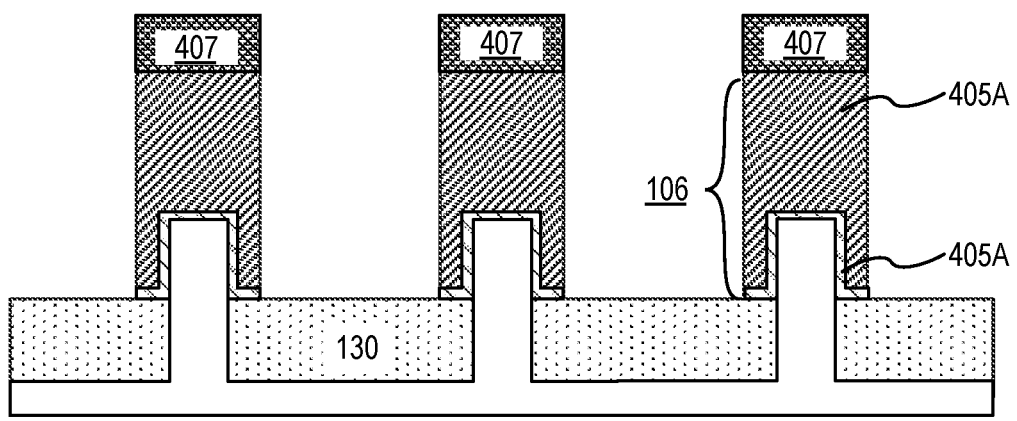

FIG. 8 illustrates the structure of FIG. 7 following the patterning of gate electrode layer 405B and gate dielectric layer 405A to form gates 106. In the illustrative embodiment, the mask 407 is utilized to pattern the gate electrode layer 405B. In an embodiment, a plasma etch is utilized to pattern the gate electrode layer 405B to form gate electrode structures and expose the underlying gate dielectric layer 405A. In an embodiment, the gate dielectric layer 405A is then subsequently removed from the uppermost surfaces and sidewalls of fin structures 102, and from uppermost surfaces of isolation 130.

Figure 9:
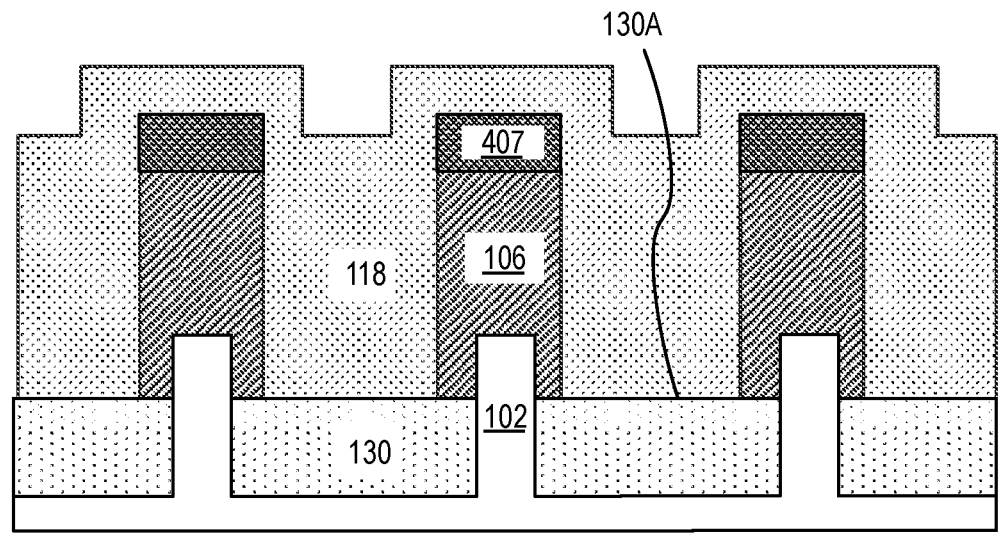
FIG. 9 illustrates a cross-sectional view of the structure of FIG. 8 following the formation of an insulator layer on the gates, on the mask, and on the isolation.

FIG. 9 illustrates the structure of FIG. 8 following the formation of an insulator layer 118 on the mask 407, on sidewalls of the gates 106, and on uppermost isolation surfaces 130A. In an embodiment, the insulator layer 118 is blanket deposited by a physical vapor deposition (PVD) process or a chemical vapor deposition (CVD) process.

Figure 10:
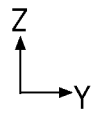
FIG. 10 illustrates a cross-sectional view of the structure of FIG. 9 following the planarization of the isolation layer and the gates.
Figure 10:
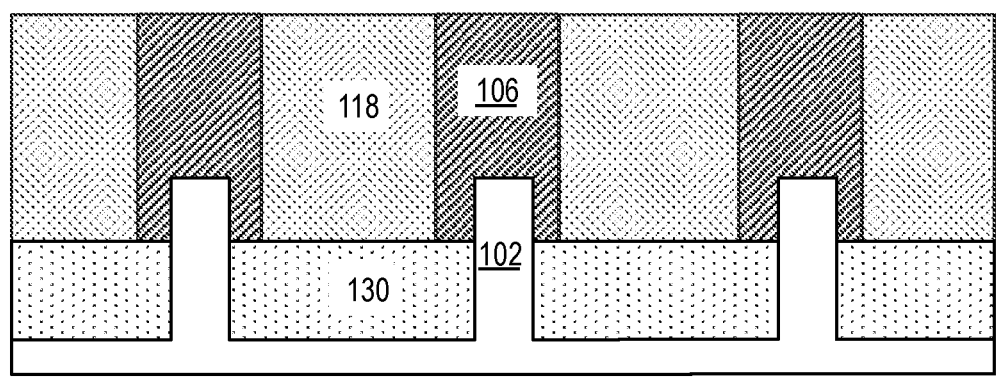

FIG. 10 illustrates the structure of FIG. 9 following planarization of the insulator layer 118. In one instance, a chemical mechanical planarization (CMP) process may be utilized to planarize the insulator layer 118 to form isolation 130. In the illustrative embodiment, the mask 407 and an uppermost portion of the gate 106 is removed by the planarization process.

Figure 11A:
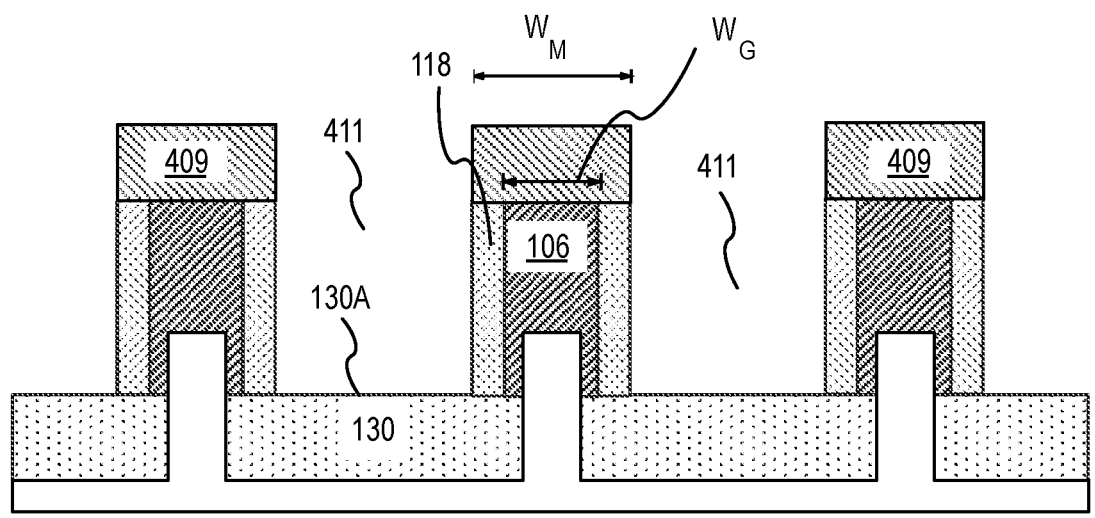
FIG. 11A illustrates a cross-sectional view of the structure of FIG. 10 following the patterning of the insulator layer.

FIG. 11A illustrates the structure of FIG. 10 following the patterning of the insulator layer 118. In an embodiment, the mask 409 includes a dielectric layer and is fabricated in a manner described above in connection with FIG. 7. The mask 409 may include a dielectric material that is substantially the same as the material of mask 407. As shown, mask 409 is formed on an uppermost surface of the gate 106 and also extends on a portion of the uppermost surface of the insulator layer 118. In the illustrative embodiment, the mask has a width, $W_M$, that is greater than a width of the gate, $W_G$, and extends on a portion of the insulator layer as illustrated.

The exposed portions of the insulator layer 118 may then be etched by a plasma etch process, selectively with respect to the underlying isolation 130, for example to form openings 411 in the insulator layer. In the illustrative embodiment, the plasma etch processed is stopped after the uppermost isolation surface 130A is exposed.

Figure 11B:
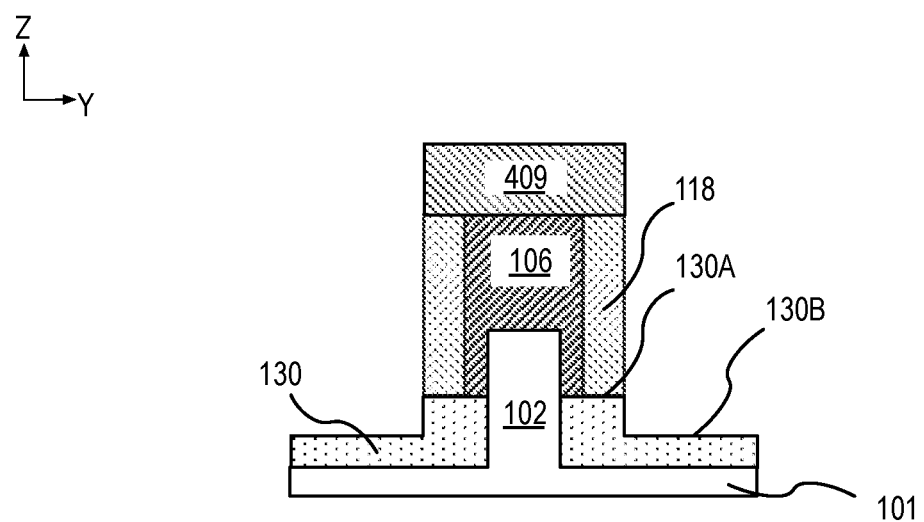
FIG. 11B illustrates a cross-sectional view of the structure of FIG. 10 following the patterning of the insulator layer and formation of recesses in portions of the isolation.

In other embodiments, the plasma etch process is continued until the isolation 130 is recessed below a level of isolation surface 130A covered by the insulator layer 118, as illustrated in FIG. 11B. In one embodiment, the isolation 130 is recessed such that a resulting second isolation surface 130B is approximately halfway between a surface of the substrate 101A and the isolation surface 130A as shown. Recessing of isolation 130 may provide advantages for inducing strain into a channel under the gate 106 when a stressor layer is formed and patterned in a later operation.

Figure 12A:
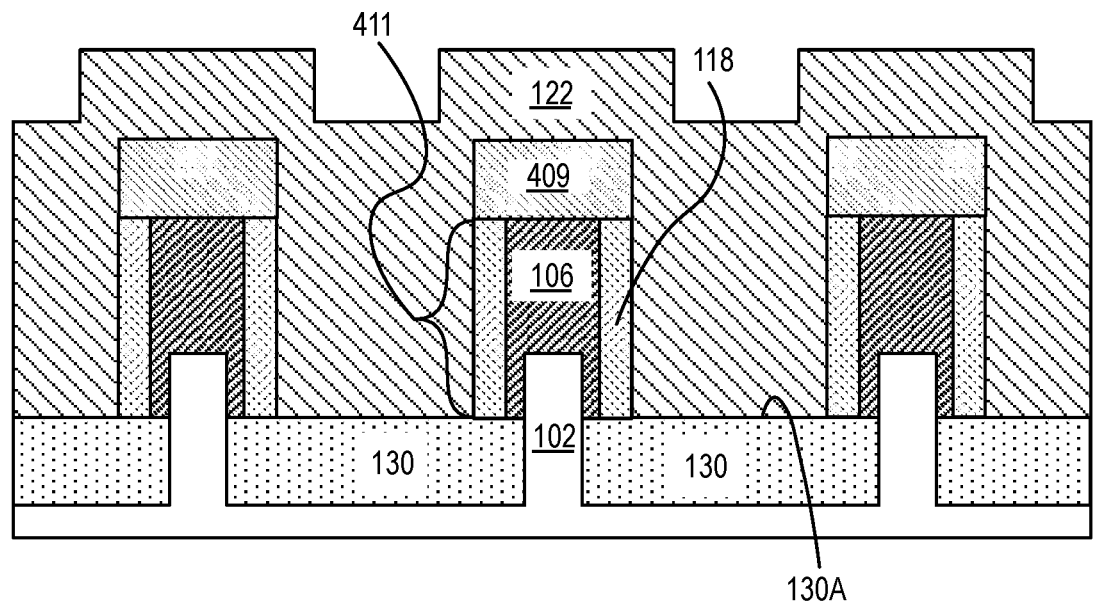
FIG. 12A illustrates a cross-sectional view of the structure of FIG. 11A following the formation of a first stressor layer on the mask, on the sidewalls of the insulator layer and on the isolation.

FIG. 12A illustrates the structure of FIG. 11 following the formation of a stressor layer 122. In the illustrative embodiment, the stressor layer 122 is blanket deposited on the mask 409, into and filing the openings 411, on sidewalls of the insulator layer 118 and on lowermost isolation surface 130A. Depending on the embodiments, the stressor layer 122 includes a material that possesses tensile or compressive strain or a material that is a dielectric that is significantly relaxed and unable to induce strain.

In one example, the stressor layer 122 includes a material that possesses tensile strain. In one such embodiment, a stressor layer 122 deposited by a chemical vapor deposition (CVD) or an atomic layer deposition (ALD) process may be tensile in nature. An ALD process may also provide conformal deposition when the opening 411 has an aspect ratio that exceeds 3:1, i.e. An opening 411 which is three times taller than it is wider. In one such embodiment, the stressor layer 122 includes a metal such as, but not limited to, W, Mo, Ta, Nb or an alloy such as TiN, WN. The tensile strength of the materials of the stressor layer 122 ranges from 0.3 GPa to 1.5 GPa.

In another example, the stressor layer 122 includes a material that possesses compressive strain. In one such embodiment, a stressor layer 122 that is blanket deposited by a physical vapor deposition (PVD) process may be compressive in nature. In one such embodiment, a compressive stressor layer 122 includes a metal such as, but not limited to, W, Mo, Ta, Nb or an alloy such as TiN, WN. The compressive strength of the materials of the stressor layer 122 ranges from 0.1 GPa to 0.3 GPa. In another example, the stressor layer 122 may include an adhesion layer and a fill layer, where the adhesion layer and the fill layer may be both tensile or compressive. In some embodiments, a high temperature anneal at temperatures over 300 degrees Celsius may be performed to relax the stressor layer 122.

In an embodiment, the stressor layer 122 may include any material that has sufficient dielectric strength to provide electrical isolation such as, but not to, limited silicon dioxide, silicon nitride, silicon oxynitride, carbon doped nitride and carbon doped oxide.

Figure 12B:
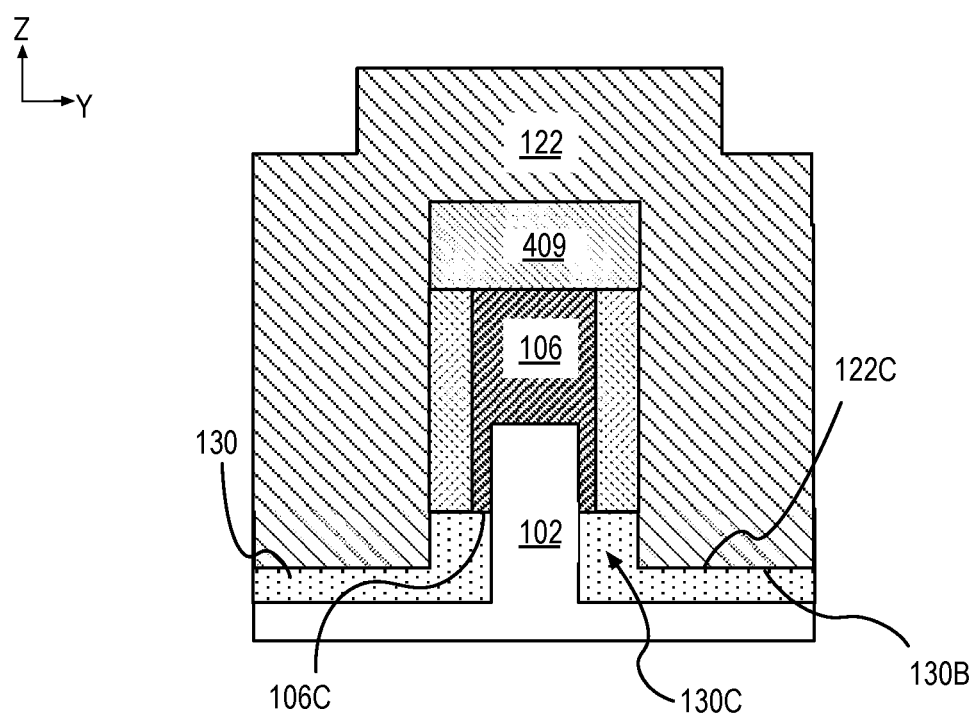
FIG. 12B illustrates a cross-sectional view of the structure of FIG. 11B following the formation of a first stressor layer on the mask, on the sidewalls of the insulator layer and on recessed portions of the isolation.

In one example, when the isolation 130 is recessed as illustrated in FIG. 12B, the stressor layer 122 has a lowermost surface 122C that is below a lowermost gate surface 106C. In one such embodiment, an isolation portion 130C separates the fin structure 102 from the stressor layer 122.

Figure 13A:
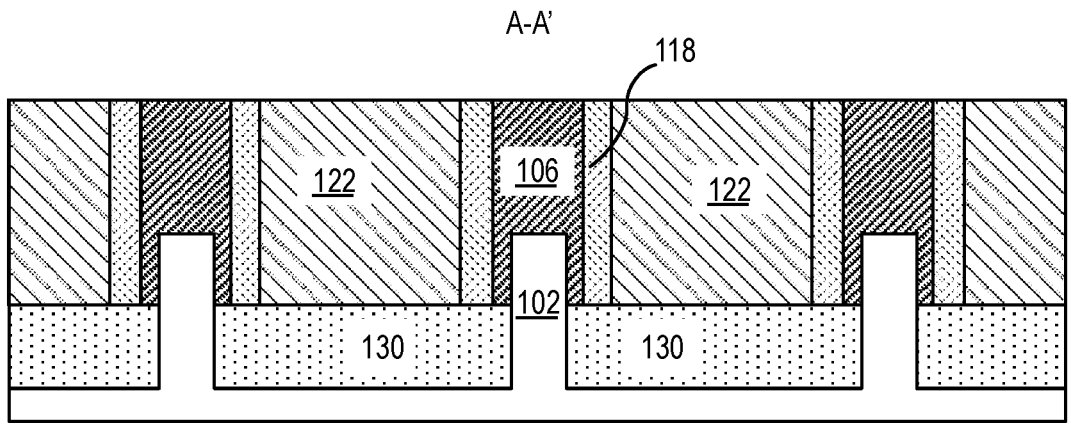
FIG. 13A illustrates a cross-sectional view of the structure of FIG. 12A following the planarization of the first stressor layer and upper portions of the gates and the insulator layer.

FIG. 13A illustrates a cross sectional view of the structure of FIG. 12A following the planarization of the stressor layer 122. In an embodiment, the planarization process is substantially similar to the planarization process described above. In the illustrative embodiment, the planarization process completely removes the mask 409, and uppermost portions of the stressor layer 122, uppermost portions of the gate 106, and uppermost portions of the insulator layer 118. In an embodiment, uppermost surfaces of the gate 106 insulator layer 118 and the stressor layer 122 are co-planar or substantially co-planar.

Figure 13B:
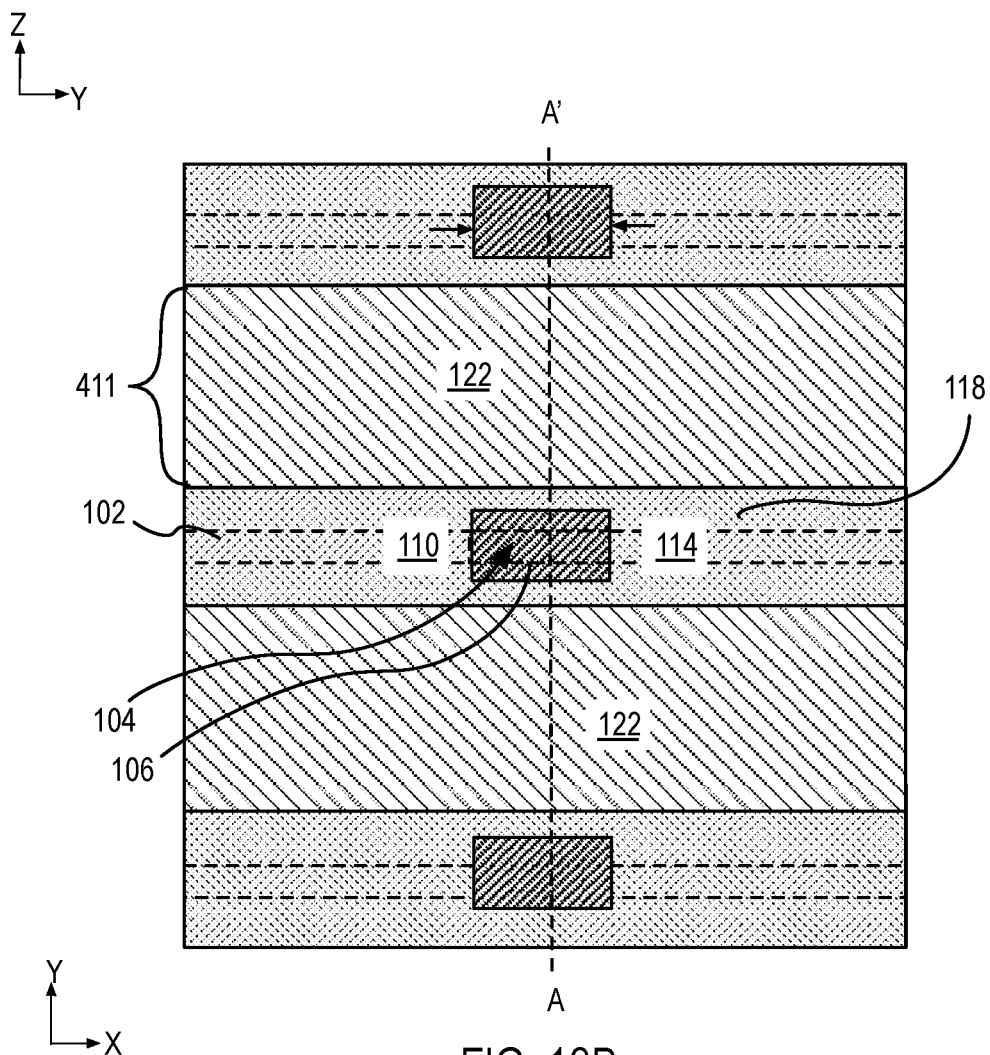
FIG. 13B illustrates a plan view of the structure of FIG. 12A.

FIG. 13B illustrates a plan view representation of FIG. 13A depicting a continuous stressor layer 122 in the opening 411 parallel to the fin structure 102 and to the insulator layer 118. It is to be appreciated that the choice of materials for the stressor layer 122 and the location of an opening, to be subsequently formed in the stressor layer 122, will determine the direction of strain that may be provided in the channel 104.

Figure 14A:
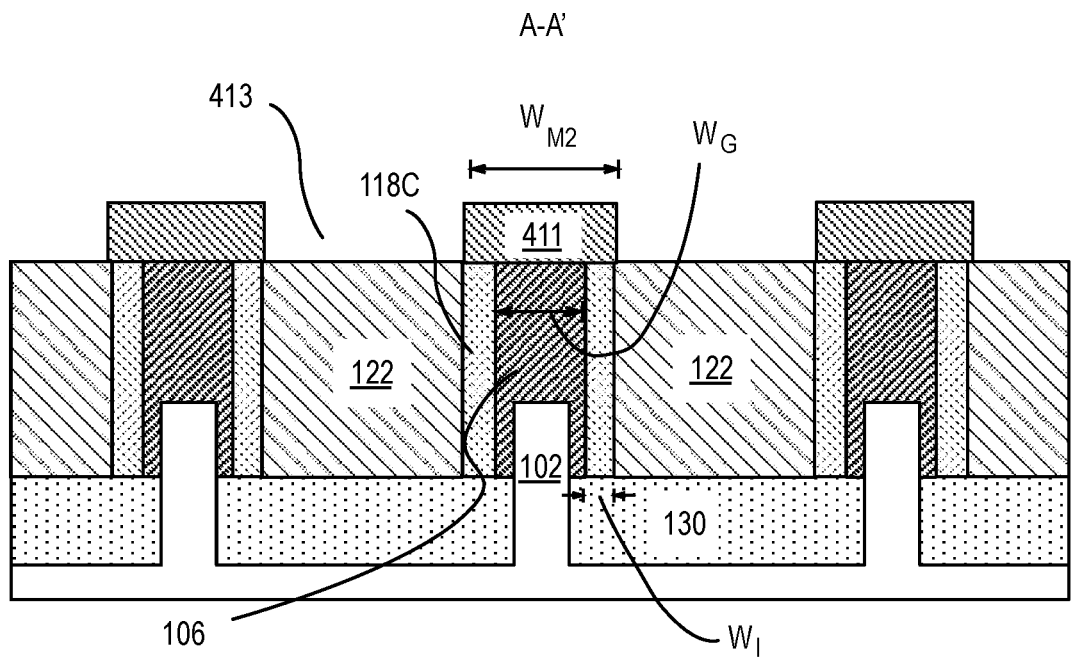
FIG. 14A illustrates a cross-sectional view of the structure of FIG. 13A following the formation of a mask to form openings in the first stressor layer.

FIG. 14A illustrates the structure of FIG. 13A following the formation of a mask 411 to define openings 413 in the stressor layer 122. Depending on embodiments, the mask 411 includes a layer of patterned resist or a material such as the material of mask 409. Depending on embodiments, the resist mask has a width, $W_{M2}$, that is at least equal to the combined width of the insulator layer portion 118C, $W_I$, on either side of gate 106, and width of gate 106, $W_G$. In some examples, when stressor layer 122 includes a metal or a metal alloy, $W_{M2}$, may be a less than the combined width of the insulator layer portion 118C, $W_I$, on either side of gate 106, and width of gate 106 $W_G$, but greater than just a width of gate 106, $W_G$, alone. This may prevent stringers of stressor material against sidewall of insulator 118C.

Figure 14B:
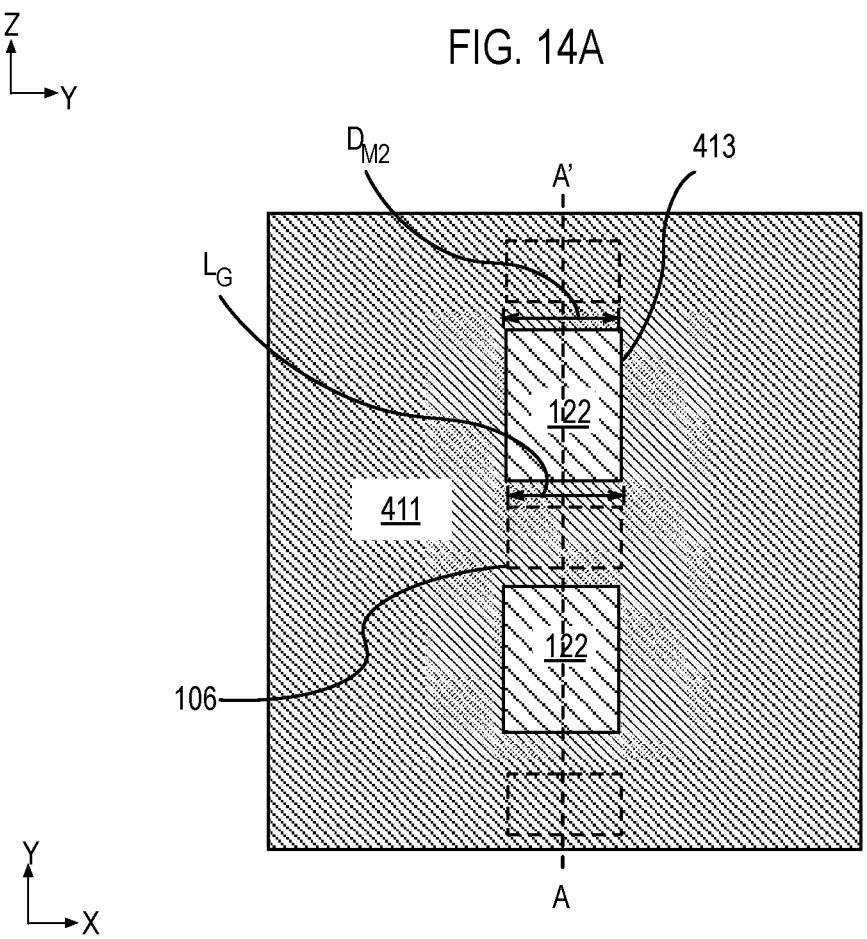
FIG. 14B illustrates a plan-view illustration of FIG. 13B following the formation of a mask depicting the location of openings to be formed in the first stressor layer.

FIG. 14B illustrates a plan view of the structure in FIG. 14A. In the illustrative embodiment, the opening 413 in the mask 411 is located adjacent to the gate 106 (dashed lines) and exposes the stressor layer 122. While the openings 413 are shown to have a dimension, $D_{M2}$, that is substantially similar to the length of the gate, $L_G$, $D_{M2}$ can in principle be less than the length, $L_G$, of the gate 106 in other examples.

Figure 15A:
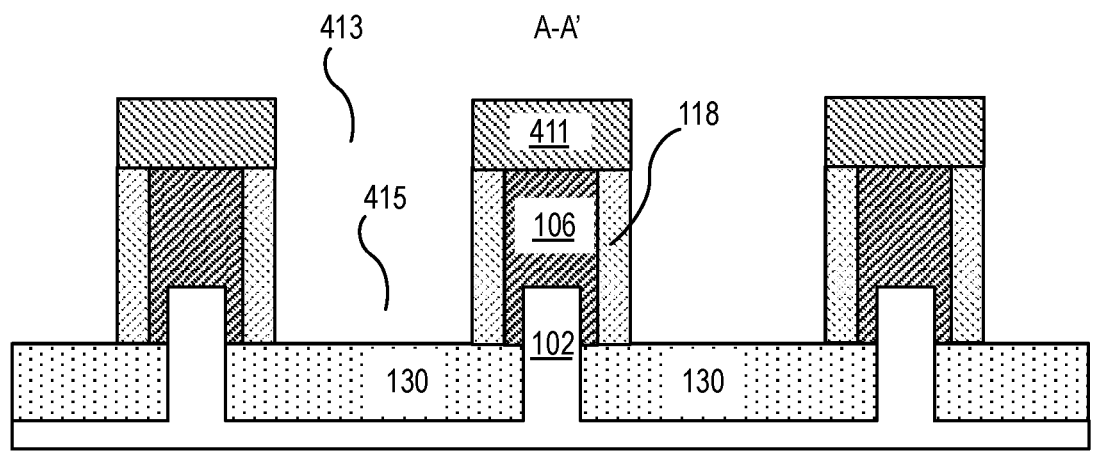
FIG. 15A illustrates a cross-sectional view of the structure of FIG. 14A following the patterning and removal of the first stressor layer adjacent to the gates.

FIG. 15A illustrates the structure of FIG. 14A following the patterning of the stressor layer 122. In an embodiment, a plasma etch is utilized to etch the stressor layer 122 through the opening 413, selectively to the mask 411 and selectively to the underlying isolation 130. The etch process forms an opening 415 in the stressor layer 122.

Figure 15B:
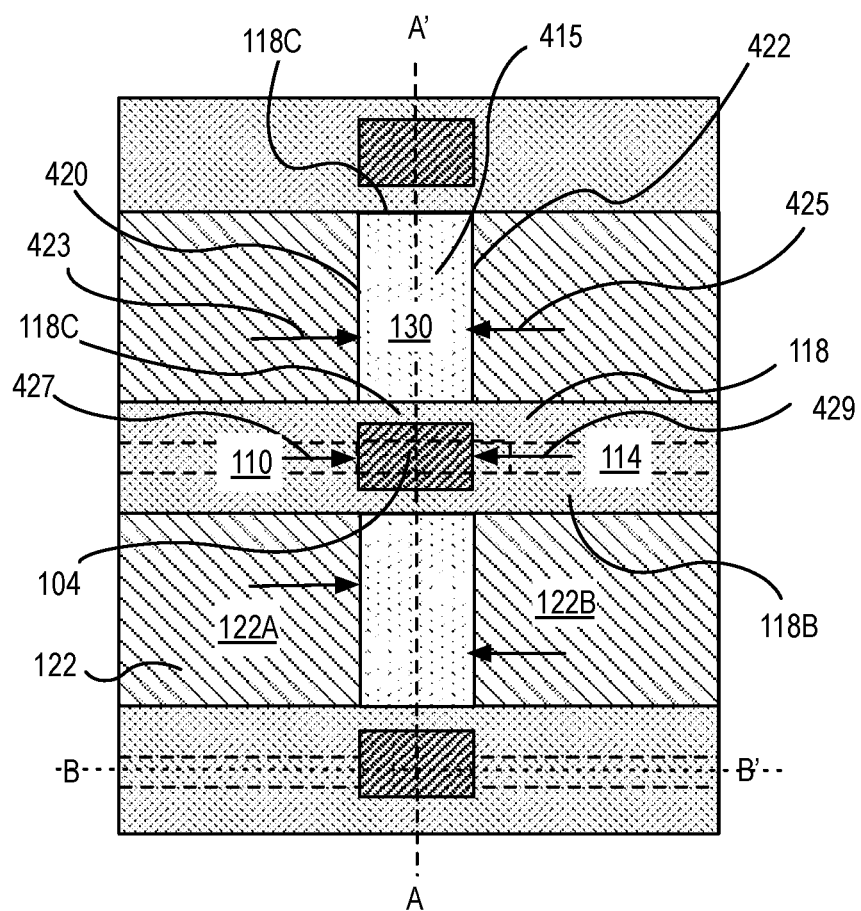
FIG. 15B illustrates a plan-view illustration of FIG. 14B showing the openings formed in the first stressor layer, adjacent to the gates, in accordance with an embodiment of the present disclosure.

FIG. 15B illustrates a plan-view of the structure of FIG. 14B following the patterning of the stressor layer 122 to form opening 415 divide the first stressor layer in to two portions, stressor layer portion 122A and first stressor layer portion 122B. Etching of the stressor layer 122 leads to relaxation of the freshly exposed surfaces 420 and 422. In an embodiment, when a stressor layer 122 includes a tensile material, forming opening 415 causes a momentary tensile stress on surfaces 420 and 422. The tensile stress on surface 420 is oppositely directed to the tensile stress on the surface 422, given by arrows 423 and 425, respectively. The tensile stress on surfaces 420 and 422 may couple strain into the channel 104 through the insulator layer 118. In the illustrative embodiment, a compressive strain may be coupled into the channel 104, through the source 110 and drain 114, respectively, as indicated by arrows 427 and 429, respectively.

It is to be appreciated that in some embodiments a spacer of the stressor layer 122 may remain inside the opening 415 against sidewalls 420, 422 and against the sidewall of the insulator layer portion 118C in the opening 415. The spacer of stressor layer 122 may be substantially thin so as to not cause any stress against the sidewalls 420, 422 and against the sidewall of the insulator layer portion 118C in the opening 415.

Figure 16A:
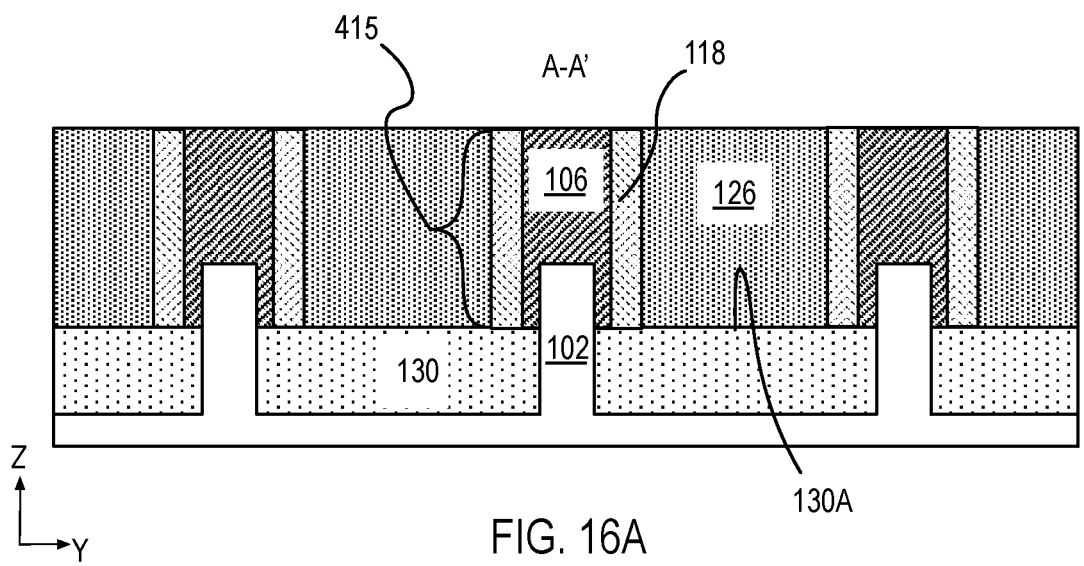
FIG. 16A illustrates the structure of FIG. 15A following the formation of a second stressor layer adjacent to gates.

FIG. 16A illustrates the structure of FIG. 15A following the formation of a stressor layer 126 into the openings 415. The stressor layer 126 may be deposited into the openings 415 using materials and methods utilized to deposit stressor layer 122 described above in association with FIGS. 12A and 12B. In one embodiment, the stressor layer 126 is blanket deposited into the openings 415 on the mask 411, on sidewalls of the insulator layer 118 and on the stressor layer 122. The stressor layer 126 includes a material designed to be complimentary to material of the stressor layer 122 from the perspective of material stress. For example, when the stressor layer 122 includes a material capable of straining the channel 104, such as an elemental metal, metal alloy, or a stressed dielectric film, the stressor layer 126 includes a relaxed dielectric material. In other embodiments, when the stressor layer 122 includes a relaxed dielectric material, then the stressor layer 126 includes a material capable of inducing strain on the channel 104, such as a metal or an alloy of the metal, or a highly stressed dielectric film. A planarization process is subsequently performed after the deposition process. The planarization process removes the mask 411, portions of insulator layer 118, portions of gate 106, portions of the stressor layer 126 on the stressor layer 122 and portions of the stressor layer 122. In an embodiment, the resulting uppermost surfaces of the insulator layer 118, gate 106, stressor layer 122 and stressor layer 126 are co-planar or substantially coplanar.

Figure 16B:
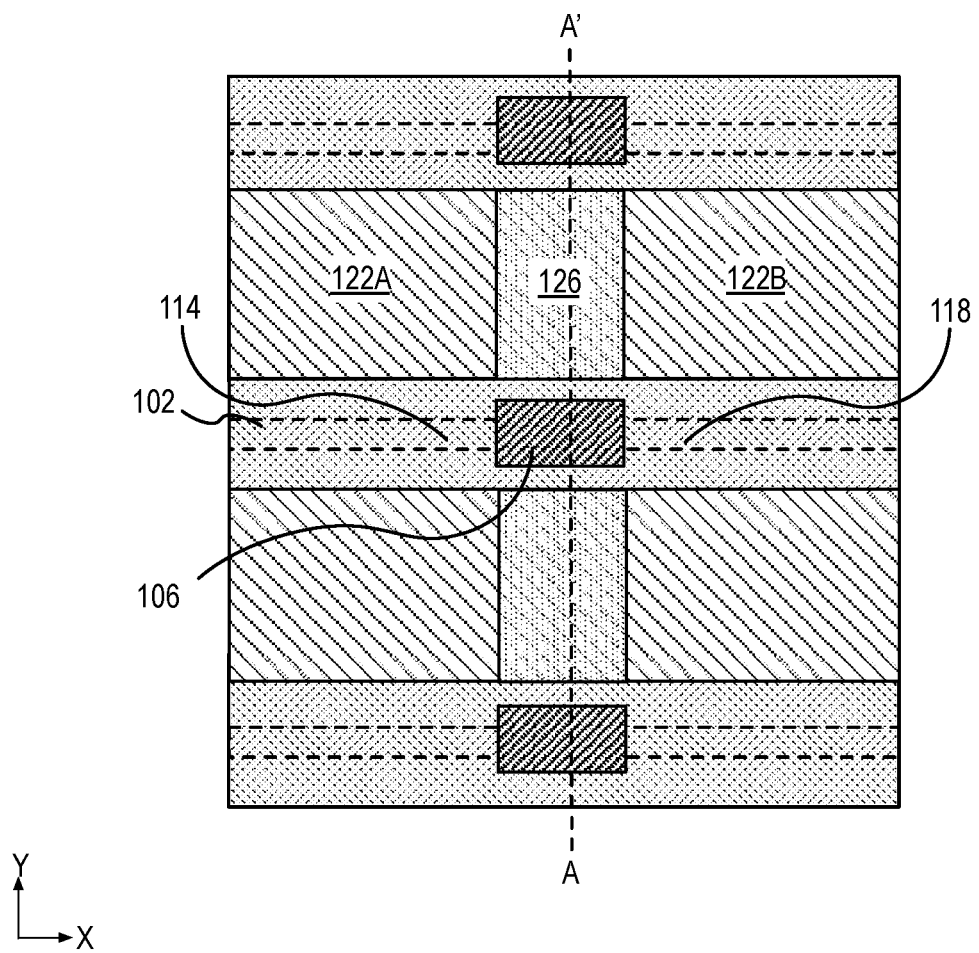
FIG. 16B illustrates a plan view of the structure of FIG. 15B following the formation of a second stressor layer into the openings formed in the first stressor layer.

FIG. 16B illustrates a plan view of the structure of FIG. 16A following the formation of the stressor layer 126 into the openings 415 formed in the stressor layer 122.

While not shown, a similar process flow may be adopted to form the structures depicted in FIGS. 2B and 2D where forming the stressor layer 122 and the stressor layer 126 includes forming a stressor layer 122 adjacent to the insulator layer 118 (such as in FIG. 12A) and then forming openings in the stressor layer 122 adjacent to the source 110 and drain 114 (similar to method illustrated in FIGS. 14A/14B and 15A/15B). The method further includes forming a stressor layer 126 in openings adjacent to the source 110 and drain 114 and planarizing the stressor layer 126.

Figure 17:
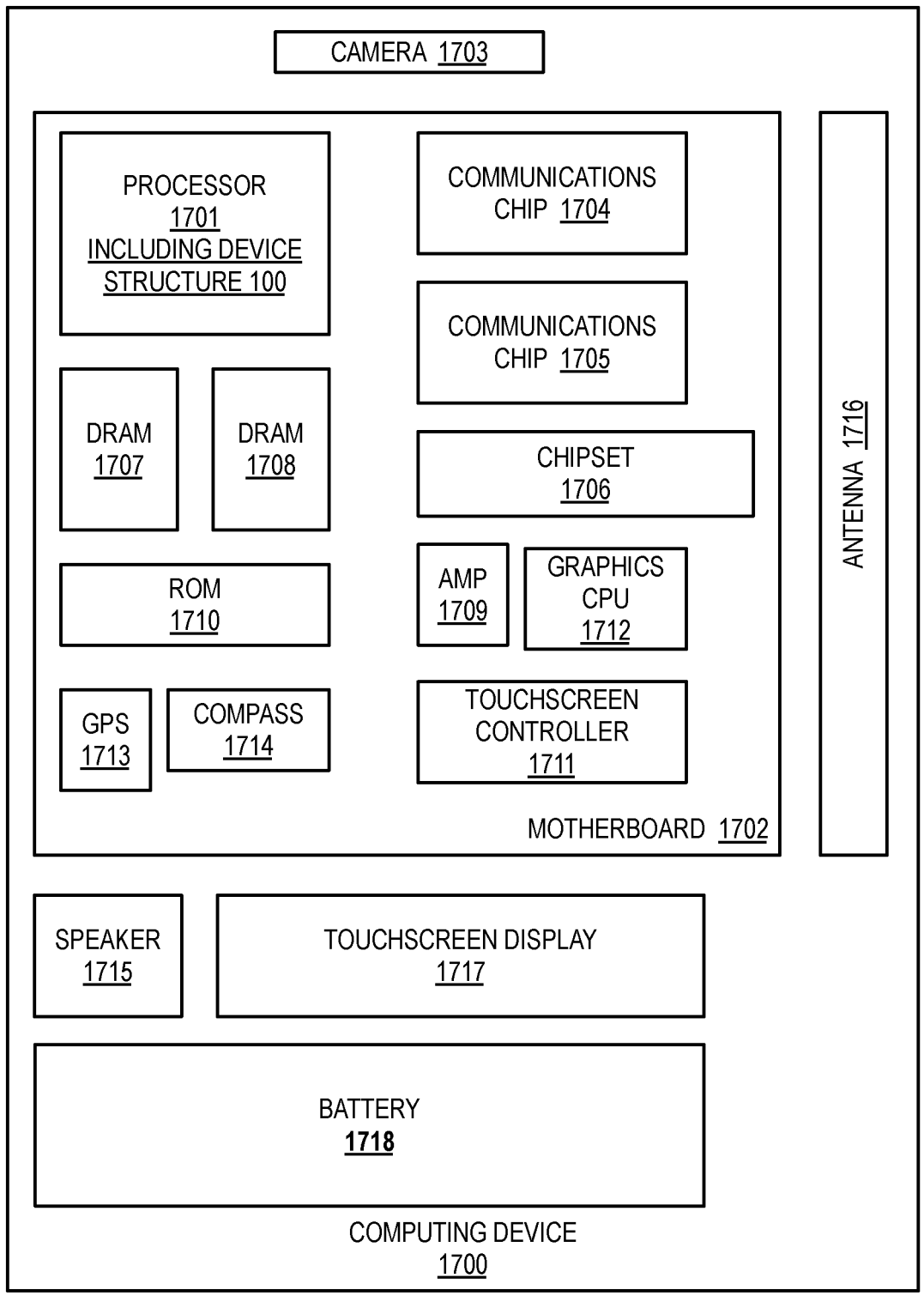
FIG. 17 illustrates a computing device in accordance with embodiments of the present disclosure.

FIG. 17 illustrates a computing device 1700 in accordance with embodiments of the present disclosure. As shown, computing device 1700 houses a motherboard 1702. Motherboard 1702 may include a number of components, including but not limited to a processor 1701 and at least one communication chip 1705. Processor 1701 is physically and electrically coupled to the motherboard 1702. In some implementations, communication chip 1705 is also physically and electrically coupled to motherboard 1702. In further implementations, communication chip 1705 is part of processor 1701.

Depending on its applications, computing device 1700 may include other components that may or may not be physically and electrically coupled to motherboard 1702. These other components include, but are not limited to, volatile memory (e.g., DRAM), non-volatile memory (e.g., ROM), flash memory, a graphics processor, a digital signal processor, a crypto processor, a chipset 1706, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 1705 enables wireless communications for the transfer of data to and from computing device 1700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1705 may implement any of a number of wireless standards or protocols, including but not limited to Wi-Fi (IEEE 802.11 family), WiMAX (IEEE 802.11 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1700 may include a plurality of communication chips 1704 and 1705. For instance, a first communication chip 1705 may be dedicated to shorter range wireless communications such as Wi-Fi and Bluetooth and a second communication chip 1704 may be dedicated to longer range wireless communications such as GPS, EDGE, GPRS, CDMA, WiMAX, LTE, Ev-DO, and others.

Processor 1701 of the computing device 1700 includes an integrated circuit die packaged within processor 1701. In some embodiments, the integrated circuit die of processor 1701 includes a device structure 200A, 200B, 200C or 200D having a stressor layer 122 and a stressor layer 126. The term "processor" may refer to any device or portion of a device that processes electronic data from registers and/or memory to transform that electronic data into other electronic data that may be stored in registers and/or memory.

Communication chip 1705 also includes an integrated circuit die packaged within communication chip 1706. In another embodiment, the integrated circuit die of communication chip 1705 includes a memory array with memory cells including device structure 100 and a non-volatile memory device coupled to the device structure 100. The non-volatile memory device may include a magnetic tunnel junction (MTJ) device, a resistive random access memory (RRAM) device or a conductive bridge random access memory (CBRAM) device.

In various examples, one or more communication chips 1704, 1705 may also be physically and/or electrically coupled to the motherboard 1702. In further implementations, communication chips 1704 may be part of processor 1701. Depending on its applications, computing device 1700 may include other components that may or may not be physically and electrically coupled to motherboard 1702. These other components may include, but are not limited to, volatile memory (e.g., DRAM) 1707, 1708, non-volatile memory (e.g., ROM) 1710, a graphics CPU 1712, flash memory, global positioning system (GPS) device 1713, compass 1714, a chipset 1706, an antenna 1716, a power amplifier 1709, a touchscreen controller 1711, a touchscreen display 1717, a speaker 1715, a camera 1703, and a battery 1718, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1700 and discussed above may contain a stand-alone integrated circuit memory die that includes one or more arrays of memory cells and device structure 100, built in accordance with embodiments of the present disclosure.

In various implementations, the computing device 1700 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1700 may be any other electronic device that processes data.

Figure 18:
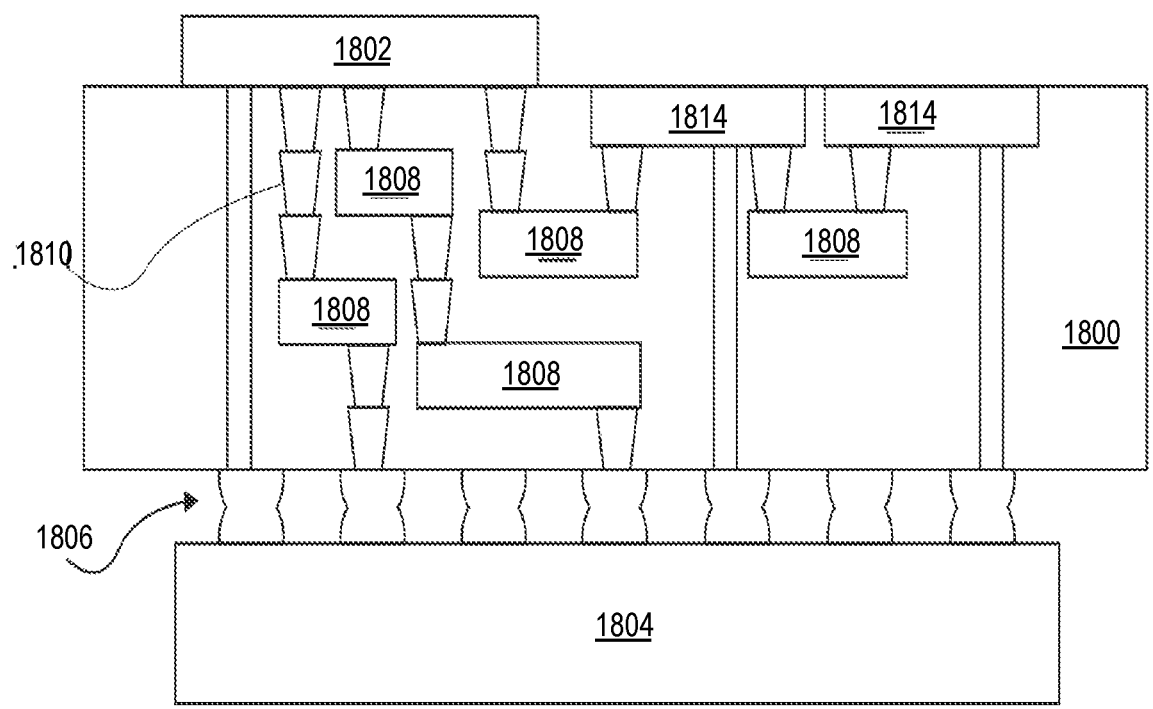
FIG. 18 illustrates an integrated circuit (IC) structure that includes one or more transistors and memory cells, all arranged in accordance with at least some embodiments of the present disclosure.

FIG. 18 illustrates an integrated circuit structure 1800 that includes one or more embodiments of the disclosure. The integrated circuit (IC) structure 1800 is an intervening structure used to bridge a first substrate 1802 to a second substrate 1804. The first substrate 1802 may be, for instance, an integrated circuit die. The second substrate 1804 may be, for instance, a memory module, a computer mother, or another integrated circuit die. The integrated circuit die may include one or more device systems such as a device structure 100, 200A, 200B, 200C or 200D having a stressor layer 122 and a stressor layer 126, for example. Generally, the purpose of an integrated circuit (IC) structure 1800 is to spread a connection to a wider pitch or to reroute a connection to a different connection. For example, an integrated circuit (IC) structure 1800 may couple an integrated circuit die to a ball grid array (BGA) 1806 that can subsequently be coupled to the second substrate 1804. In some embodiments, the first and second substrates 1802/1804 are attached to opposing sides of the integrated circuit (IC) structure 1800. In other embodiments, the first and second substrates 1802/1804 are attached to the same side of the integrated circuit (IC) structure 1800. And in further embodiments, three or more substrates are interconnected by way of the integrated circuit (IC) structure 1800.

The integrated circuit (IC) structure 1800 may be formed of an epoxy resin, a fiberglass-reinforced epoxy resin, a ceramic material, or a polymer material such as polyimide. In further implementations, the integrated circuit (IC) structure 1800 may be formed of alternate rigid or flexible materials that may include the same materials described above for use in a semiconductor substrate, such as silicon, germanium, and other group III-N, group III-V and group IV materials.

The integrated circuit (IC) structure 1800 may include metal interconnects 1808 and via 1810, including but not limited to through-silicon vias (TSVs) 1810. The integrated circuit (IC) structure 1800 may further include embedded devices 1814, including both passive and active devices. Such devices include, but are not limited to, capacitors, decoupling capacitors, resistors, inductors, fuses, diodes, transformers, transistors including device structure 200A, 200B, 200C or 200D having a stressor layer 122 and a stressor layer 126, one or more magnetic tunnel junction or resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 1800. In accordance with embodiments of the present disclosure, apparatuses or processes disclosed herein may be used in the fabrication of integrated circuit (IC) structure 1800.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Thus, embodiments of the present disclosure include devices having isolation wall stressor structure for logic, SoC and embedded memory applications and their methods of fabrication.

In a first example, a device structure includes a fin structure, a gate on the fin structure, a source and a drain on the fin structure, where the gate is between the source and the drain. The device further includes an insulator layer having a first portion adjacent to a sidewall of the source, a second portion adjacent to a sidewall of the drain, and a third portion therebetween, where the third portion is adjacent to a sidewall of the gate and two or more stressor materials are adjacent to the insulator layer.

In second examples, for any of first examples, at least one of the stressor materials includes a metal.

In third examples, for any of the first through second examples, a first of the stressor materials is adjacent to the first and second insulator layer portions and a second of the stressor materials is adjacent to the third insulator layer portion.

In fourth examples, for any of the first through third examples, the first of the stressor materials includes at least one of a metal such as, but not limited to, titanium, tungsten, cobalt, ruthenium, and titanium or at least one of a compound including titanium, a compound including tantalum, a compound including a group III material or a compound of tungsten, and the second of the stressor materials includes a compound of silicon and at least one of oxygen or nitrogen.

In fifth examples, for any of the first through fourth examples, the second of the stressor materials includes at least one of a metal such as, but not limited to, titanium, tungsten, cobalt, ruthenium, and titanium or at least one of a compound including titanium, a compound including tantalum, a compound including a group III material or a compound of tungsten, and the first of the stressor materials includes a compound a silicon and at least one of oxygen or nitrogen.

In sixth examples, for any of the first through fifth examples, the first of the stressor materials has portions adjacent to the gate.

In seventh examples, for any of the first through sixth examples, a dielectric spacer is laterally adjacent to the gate, on the fin structure.

In eighth examples, for any of the first through seventh examples, the first of the stressor materials induces a larger magnitude of strain on the fin than the second of the stressor materials.

In ninth examples, for any of the first through eighth examples, the second of the stressor materials induces a larger magnitude of strain on the fin than the first of the stressor materials.

In tenth examples, for any of the first through ninth examples, the gate further includes a gate dielectric layer on the fin structure and a gate electrode on the gate dielectric layer, and the source and drain include one of P-type or N-type impurity dopants.

In an eleventh example, a method of forming a device includes forming a fin structure and forming an isolation surrounding the fin structure. The method further includes forming a gate on a portion of the fin structure and on a portion of the isolation, and forming a source and a drain on the fin structure, where the source and the drain are separated by the gate. The method continues with forming an insulator layer adjacent to the fin and gate structure, where the insulator layer has a first insulator layer portion adjacent to a sidewall of the source, a second insulator layer portion adjacent to a sidewall of the drain, and a third insulator layer portion therebetween adjacent to a sidewall of the gate. The method further includes forming two or more stressor materials adjacent to the insulator layer on a portion of the isolation.

In twelfth examples, for any of the eleventh example, forming two or more stressor materials includes forming a first of the stressor materials adjacent to the insulator layer and then forming an opening in the first of the stressor materials adjacent to the third insulator portion and forming a second of the stressor material in the opening.

In thirteenth examples, for any of the eleventh through twelfth examples, where forming the first stressor material includes forming a layer of a metal such as, but not limited to, titanium, tungsten, cobalt, ruthenium, and titanium or at least one of a compound including titanium, a compound including tantalum, a compound including a group III material or a compound of tungsten, and where forming the second stressor material includes forming a compound of silicon and at least one of oxygen or nitrogen.

In fourteenth example, for any of the eleventh through thirteenth examples, forming the second stressor material includes forming a layer of a metal such as, but not limited to, titanium, tungsten, cobalt, ruthenium, and titanium or at least one of a compound including titanium, a compound including tantalum, a compound including a group III material or a compound of tungsten, and where forming the first stressor material includes forming a compound of silicon and at least one of oxygen or nitrogen.

In fifteenth example, for any of the eleventh through fourteenth examples, forming the one or more stressor structure includes recessing a portion of the isolation below a level of a lowermost surface of the gate.

In sixteenth examples, for any of the eleventh through fifteenth examples, forming two or more stressor materials includes forming a first of the stressor materials adjacent to the insulator layer and then forming an opening in the first of the stressor materials adjacent to the first and second insulator portions and forming a second of the stressor material in the opening.

In a seventeenth example, a stacked device structure includes a first device structure having a first fin structure, a first gate on the first fin structure and a first source and a first drain on the fin structure. The first gate is between the first source and the first drain. The first device further includes an insulator layer having a first insulator layer portion adjacent to a sidewall of the source, a second insulator layer portion adjacent to a sidewall of the drain, and a third insulator layer portion therebetween adjacent to a sidewall of the gate. The first device further includes a first stressor material adjacent to the first insulator layer portion and adjacent to the second insulator layer portion and a second stressor material adjacent to the third insulator layer portion. The stacked device structure further includes a second device structure above the first device structure, the second device structure includes a second fin structure, a second gate on the second fin structure and a second source and a second drain on the second fin structure. The second device structure further includes a dielectric layer having a first dielectric layer portion adjacent to a sidewall of the second source, a second dielectric layer portion adjacent to a sidewall of the second drain, and a third dielectric layer portion therebetween adjacent to a sidewall of the second gate. The second device structure further includes a third stressor material adjacent to the first dielectric layer portion and adjacent to the second dielectric layer portion, and a fourth stressor material adjacent to the third dielectric layer portion.

In eighteenth examples, for any of the seventeenth example, at least one of the stressor materials includes a metal.

In nineteenth examples, for any of the seventeenth through eighteenth examples, the first stressor material and the third stressor material includes at least one of a metal such as, but not limited to, titanium, tungsten, cobalt, ruthenium, and titanium or at least one of a compound including titanium, a compound including tantalum, a compound including a group III material or a compound of tungsten, and the second stressor material and the fourth stressor material includes a compound of silicon and at least one of oxygen or nitrogen.

In twentieth example, for any of the seventeenth through nineteenth examples, the first stressor material and the fourth stressor material each include at least one of a metal such as, but not limited to, titanium, tungsten, cobalt, ruthenium, and titanium or at least one of a compound including titanium, a compound including tantalum, a compound including a group III material or a compound of tungsten, and the second stressor material and the third stressor material each include a compound of silicon and at least one of oxygen or nitrogen.

In twenty first examples, for any of the seventeenth through twentieth examples, the second stressor material and the fourth stressor material each include at least one of a metal such as, but not limited to, titanium, tungsten, cobalt, ruthenium, and titanium or at least one of a compound including titanium, a compound including tantalum, a compound including a group III material or a compound of tungsten, and the first stressor material and the third stressor material each include a compound of silicon and at least one of oxygen or nitrogen.

In twenty second examples, for any of the seventeenth through twenty first examples, the second stressor material and the third stressor material each include at least one of a metal such as, but not limited to, titanium, tungsten, cobalt, ruthenium, and titanium or at least one of a compound including titanium, a compound including tantalum, a compound including a group III material or a compound of tungsten, and the first stressor material and the fourth stressor material each include a compound of silicon and at least one of oxygen or nitrogen.

In twenty third examples, for any of the twentieth through twenty second examples, the first stressor material includes at least one of a metal such as, but not limited to, titanium, tungsten, cobalt, ruthenium, and titanium or at least one of a compound including titanium, a compound including tantalum, a compound including a group III material or a compound of tungsten, and the second stressor material, the third stressor material and the fourth stressor material each include a compound of silicon and at least one of oxygen or nitrogen.

In twenty fourth examples, for any of the seventeenth through twenty third examples, the first gate is on a plane directly above the second gate and where the first fin structure is on a plane directly above the second fin structure.

In twenty fifth examples, for any of the seventeenth through twenty fourth examples, the first fin structure is parallel to the second fin structure and the first gate structure is parallel to the second gate structure.

What is claimed is:

1. A device structure comprising:
   a fin structure;
   a gate on the fin structure;
   a source and a drain on the fin structure, the gate between the source and the drain;
   an insulator layer having a first portion where an inner sidewall of the insulator layer is adjacent to a sidewall of the source, a second portion where the inner sidewall is adjacent to a sidewall of the drain, and a third portion where the inner sidewall is adjacent to a sidewall of the gate; and
   two or more stressor materials adjacent to an outer sidewall of the insulator layer, wherein a first of the stressor materials is adjacent to the outer sidewall of the first and second insulator layer portions, but not adjacent to the outer sidewall of the third insulator layer portion, and a second of the stressor materials is adjacent to the outer sidewall of the third insulator layer portion, but not adjacent to the outer sidewall of the first or second insulator layer portions.

2. The device structure of claim 1, wherein the first of the stressor materials comprises a metal.

3. The device structure of claim 1, wherein the first of the stressor materials includes at least one of titanium, tungsten, cobalt, ruthenium, or titanium, or at least one of a compound comprising titanium, a compound comprising tantalum, a compound comprising a group III material, or a compound of tungsten, and the second of the stressor materials comprises a compound of silicon and at least one of oxygen or nitrogen.

4. The device structure of claim 1, wherein the second of the stressor materials includes at least one titanium, tungsten, cobalt, ruthenium, or titanium, or at least one of a compound comprising titanium, a compound comprising tantalum, a compound comprising a group III material, or a compound of tungsten, and the first of the stressor materials comprises a compound a silicon and at least one of oxygen or nitrogen.

5. The device structure of claim 1, wherein the first of the stressor materials has portions adjacent to the gate.

6. The device structure of claim 1, wherein a dielectric spacer is laterally adjacent to the gate, on the fin structure.

7. The device structure of claim 1, wherein the first of the stressor materials induces a larger magnitude of strain on the fin than the second of the stressor materials.

8. The device structure of claim 3, wherein the second of the stressor materials induces a larger magnitude of strain on the fin than the first of the stressor materials.

9. The device structure of claim 1, wherein the gate further includes a gate dielectric layer on the fin structure and a gate electrode on the gate dielectric layer, and the source and drain include one of P-type or N-type impurity dopants.

10. A method of forming a device, the method comprising:
    forming a fin structure;
    forming an isolation surrounding the fin structure;
    forming a gate on a portion of the fin structure and on a portion of the isolation;
    forming a source and a drain on the fin structure, the source and the drain separated by the gate;
    forming an insulator layer with an inner sidewall adjacent to the fin and gate structure, the insulator layer having a first insulator layer portion where the inner sidewall is adjacent to a sidewall of the source, a second insulator layer portion where the inner sidewall is adjacent to a sidewall of the drain, and a third insulator layer portion where the inner sidewall is adjacent to a sidewall of the gate; and
    forming two or more stressor materials adjacent to an outer sidewall of the insulator layer and on a portion of the isolation, wherein forming the two or more stressor materials comprises forming a first of the stressor materials adjacent to the outer sidewall of the insulator layer and then forming an opening in the first of the stressor materials adjacent to the outer sidewall of the third insulator portion and forming a second of the stressor materials in the opening and separated from the sidewall of the gate by the third insulator portion.

11. The method of claim 10, wherein forming the first stressor material comprises forming a layer of titanium, tungsten, cobalt, ruthenium, and titanium or a compound comprising titanium, a compound comprising tantalum, a compound comprising a group III material or a compound of tungsten, and wherein forming the second stressor material comprises forming a compound of silicon and at least one of oxygen or nitrogen.

12. The method of claim 10, wherein forming the second stressor material comprises forming a layer of titanium, tungsten, cobalt, ruthenium, and titanium or a compound comprising titanium, a compound comprising tantalum, a compound comprising a group III material or a compound of tungsten, and wherein forming the first stressor material comprises forming a compound of silicon and at least one of oxygen or nitrogen.

13. The method of claim 10, wherein forming the one or more stressor structure comprises recessing a portion of the isolation below a level of a lowermost surface of the gate.

14. The method of claim 10, wherein forming two or more stressor materials comprises forming a first of the stressor materials adjacent to the insulator layer and then forming an opening in the first of the stressor materials adjacent to the first and second insulator portions and forming a second of the stressor material in the opening.

15. A stacked device structure comprising:
   a first device structure comprising:
      a first fin structure;
      a first gate on the first fin structure;
      a first source and a first drain on the fin structure, the first gate between the first source and the first drain;
      an insulator layer having a first insulator layer portion where an inner sidewall of the insulator layer is adjacent to a sidewall of the source, a second insulator layer portion where the inner sidewall is adjacent to a sidewall of the drain, and a third insulator layer portion where the inner sidewall is adjacent to a sidewall of the gate; and
      a first stressor material adjacent to an outer sidewall of both the first insulator layer portion and the second insulator layer portion, but not adjacent to the outer sidewall of the third insulator layer portion, and a second stressor material adjacent to the outer sidewall of the third insulator layer portion, but not adjacent to the outer sidewall of the first or second insulator layer portions; and
   a second device structure above the first device structure, the second device structure comprising:
      a second fin structure;
      a second gate on the second fin structure;
      a second source and a second drain on the second fin structure;
      a dielectric layer having a first dielectric layer portion where an inner sidewall of the dielectric layer is adjacent to a sidewall of the second source, a second dielectric layer portion where the inner sidewall of the dielectric layer is adjacent to a sidewall of the second drain, and a third dielectric layer portion where the inner sidewall of the dielectric layer is adjacent to a sidewall of the second gate; and
      a third stressor material adjacent to an outer sidewall of the first dielectric layer portion and the second dielectric layer portion, but not adjacent to the outer sidewall of the third dielectric layer portion, and a fourth stressor material adjacent to the outer sidewall of the third dielectric layer portion, but not adjacent to the outer sidewall of the first or second dielectric layer portions.

16. The device structure of claim 15, wherein at least one of the stressor materials comprises a metal.

17. The device structure of claim 15, wherein the first gate is on a plane directly above the second gate and wherein the first fin structure is on a plane directly above the second fin structure.

18. The device structure of claim 15, wherein the first fin structure is parallel to the second fin structure and the first gate structure is parallel to the second gate structure.

* * * * *